United States Patent
Ting et al.

(10) Patent No.: US 9,018,724 B2
(45) Date of Patent: Apr. 28, 2015

(54) METHOD OF PRODUCING OPTICAL MEMS

(75) Inventors: Albert Ting, Amesbury, MA (US); Daniel T. McCormick, Richmond, CA (US); Michael Rattner, San Francisco, CA (US)

(73) Assignee: AdvancedMEMS LLP, Richmond, CA (US)

( * ) Notice: Subject to any disclaimer, the term of this patent is extended or adjusted under 35 U.S.C. 154(b) by 0 days.

(21) Appl. No.: 12/057,913

(22) Filed: Mar. 28, 2008

(65) Prior Publication Data

US 2009/0039489 A1 Feb. 12, 2009

Related U.S. Application Data

(60) Provisional application No. 60/908,473, filed on Mar. 28, 2007.

(51) Int. Cl.
*H01L 31/0203* (2014.01)
*B81C 3/00* (2006.01)

(52) U.S. Cl.
CPC ....... *B81C 3/002* (2013.01); *H01L 2224/48091* (2013.01); *H01L 2224/4824* (2013.01); *H01L 2224/45147* (2013.01); *H01L 2924/10253* (2013.01); *H01L 2924/01047* (2013.01); *H01L 2924/3025* (2013.01)

(58) Field of Classification Search
USPC .............. 257/98, 99, 432, 433, 444, 446, 257/E33.062; 438/52; 365/88, 92
See application file for complete search history.

(56) References Cited

U.S. PATENT DOCUMENTS

| | | | | |
|---|---|---|---|---|
| 4,786,965 | A | 11/1988 | Yabe | 358/98 |
| 5,098,630 | A | 3/1992 | Ogiu et al. | 264/272 |
| 5,222,175 | A * | 6/1993 | Tatoh | 385/93 |
| 6,522,913 | B2 | 2/2003 | Swanson et al. | 600/478 |
| 6,562,545 | B1 * | 5/2003 | Hembree et al. | 430/313 |
| 6,668,185 | B2 | 12/2003 | Toida | 600/425 |
| 6,784,020 | B2 | 8/2004 | Lee et al. | 438/106 |
| 6,813,102 | B2 * | 11/2004 | Furuichi et al. | 359/819 |
| 7,091,599 | B2 | 8/2006 | Fujimori | 257/692 |
| 2003/0142934 | A1 | 7/2003 | Pan et al. | 385/116 |
| 2003/0233028 | A1 * | 12/2003 | Tokuda et al. | 600/160 |
| 2003/0236443 | A1 | 12/2003 | Cespedes et al. | 600/29 |
| 2004/0052468 | A1 * | 3/2004 | Pham et al. | 385/52 |
| 2004/0076366 | A1 * | 4/2004 | Yun et al. | 385/18 |
| 2004/0126050 | A1 * | 7/2004 | Claydon et al. | 385/14 |

(Continued)

OTHER PUBLICATIONS

Aaron D. Aguirre, et al., *Two-axis MEMS Scanning Catheter for Ultrahigh Resolution Three-dimensional and En Face Imaging*, Optics Express, vol. 15, No. 5, Mar. 5, 2007.

*Primary Examiner* — Su C Kim
(74) *Attorney, Agent, or Firm* — Seyfarth Shaw LLP; Joseph P. Quinn; Joseph M. Walker

(57) ABSTRACT

A method and apparatus for constructing MEMS devices is provided which employs a low cost molded housing that simultaneously provides precise and accurate alignment, mechanical protection, electrical connections and structural integrity for mounting optical and MEMS components. The package includes a MEMS die mounting surface, an optical component mounting surface and an optical imaging window monolithically fabricated with the MEMS die mounting surface in a predetermined orientation for providing alignment between the MEMS die and optical components. A MEMS adaptor plate is provided to facilitate connections of a MEMS die to external components.

19 Claims, 39 Drawing Sheets

(56) References Cited

U.S. PATENT DOCUMENTS

| | | | |
|---|---|---|---|
| 2005/0009246 A1* | 1/2005 | Enquist et al. | 438/127 |
| 2005/0143664 A1 | 6/2005 | Chen et al. | 600/478 |
| 2005/0167795 A1* | 8/2005 | Higashi | 257/678 |
| 2006/0001123 A1* | 1/2006 | Heck et al. | 257/528 |
| 2006/0056017 A1* | 3/2006 | Berier et al. | 359/380 |
| 2006/0186906 A1* | 8/2006 | Bottoms et al. | 324/754 |
| 2006/0195126 A1 | 8/2006 | Snow et al. | 606/159 |
| 2006/0206102 A1 | 9/2006 | Shimmick | 606/4 |
| 2006/0217594 A1 | 9/2006 | Ferguson | 600/175 |
| 2007/0066871 A1 | 3/2007 | Yang et al. | 600/173 |
| 2007/0072321 A1* | 3/2007 | Sherrer et al. | 438/26 |
| 2007/0191682 A1* | 8/2007 | Rolland et al. | 600/173 |

* cited by examiner

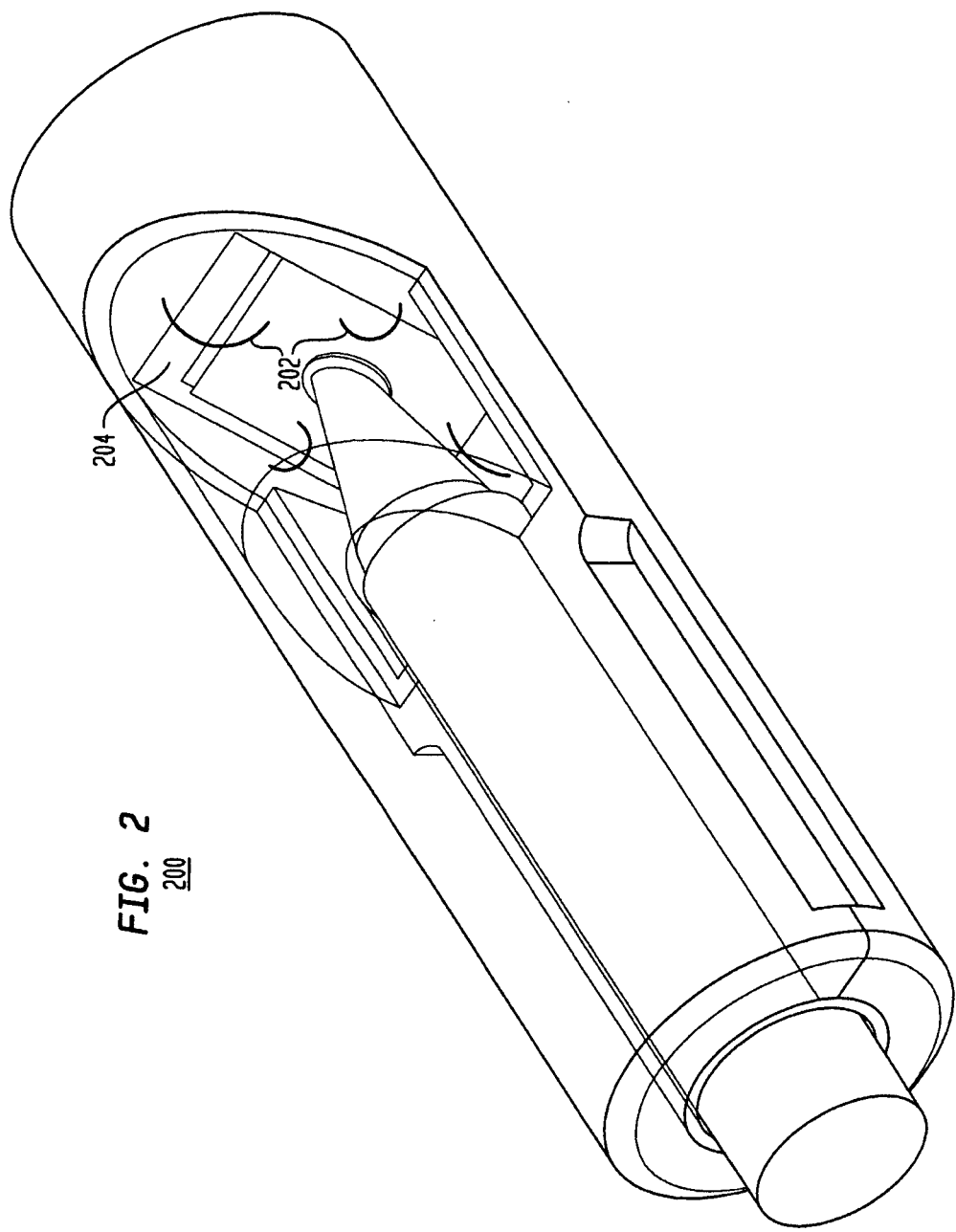

1400

METHOD OF PRODUCING OPTICAL MEMS

CROSS REFERENCE TO RELATED APPLICATIONS

This application claims priority from U.S. Provisional Patent Application No. 60/908,473 filed on Mar. 28, 2007 which is incorporated herein by reference in its entirety.

FIELD OF THE INVENTION

The present invention relates to optical microelectromechanical systems (MEMS), and more particularly to scalable, modular, and cost effective methods of optical MEMS system production.

BACKGROUND OF THE INVENTION

MEMS fabrication technologies share common origins with those used by the microelectronics industry, however, these technologies are now quite different. For example, integrated circuit (IC) fabrication is a largely 2D process and topology is to be minimized or avoided, while MEMS fabrication makes use of fabrication topology to generate 3D structures. Additionally, IC fabrication separates the processes of assembly and packaging, whereas the integration of these steps is an essential component of MEMS fabrication.

Currently, MEMS devices are assembled and placed in a planar package. These packages provide the MEMS device with electrical, and in many cases optical connections or some way of interacting with the environment. In the case of optical MEMS devices, this environmental interaction typically occurs via a window. The planar package is then attached to a second level package that performs alignment and protection of the entire system. Disadvantageously, this arrangement uses a large amount of space, which is a significant problem for optical MEMS devices for use in biomedical imaging.

In most electronic devices, the molded packaging acts as an exterior barrier to protect the encased device. Other special purpose substrates and wires are used to conduct signals. For example, most electronic components are in packages which are in turn mounted on a printed circuit board (PCB). The PCB provides conductive layers for signal routing. The completed PCB is then placed in an enclosure that provides protection from the environment. Disadvantageously, this method of packaging is not efficient in terms of either area or volume, and the minimum possible device size is too large for many biomedical imaging applications. Another disadvantage is that PCBs do not lend themselves to complex geometry. Achieving alignment between multiple components may necessitate multiple boards mounted in different locations in an enclosure, further increasing the minimum possible size of a system.

Connecting a MEMS device to other components is generally more difficult than connecting electronic devices to other components. MEMS devices also tend to be much more sensitive to static and other environmental issues such as moisture and heat than solid-state devices. Disadvantageously, in many cases the presence of moving parts in a MEMS device prevents the use of standard connectivity techniques such as solder balls. Wirebonding is a frequently used technique to connect to MEMS devices, however, it suffers the disadvantage that it traditionally requires a large amount of space in which the wirebonds from the die are typically connected to pads located around the die. Furthermore, wirebonding limits the design options of the package because of the need for vertical clearance above the die for the wirebonding operation.

SUMMARY OF THE INVENTION

Illustrative embodiments of the invention provide a low cost molded housing that simultaneously provides precise and accurate alignment of optical and MEMS components, mechanical protection, an optical imaging window, electrical connections and structural integrity. The invention also provides a method of connecting a MEMS chip to external components.

Packaging plays a critical role in the successful creation of a MEMS device such as a MEMS based OCT probe. The MEMS package provides a structural element and casing of a MEMS based probe. In illustrative embodiments of the present invention, packaging is entwined with the actual shape and properties of the MEMS device itself for physical attachment and operation.

A MEMS package produced according to the present invention offers mechanical protection for the MEMS device and other optical elements while simultaneously providing optical alignment and an imaging window while the probe is positioned in the body, an environment potentially hostile to active MEMS devices. The package also provides electrical connections and optical interconnects to the MEMS device and other active devices attached to it. In addition, the invention provides an acceptable method of physical seating of the MEMS device and other elements of the probe. Illustrative embodiment of the invention also provide methods of keeping the lens surface of a MEMS probe clean.

The inventive MEMS package is optimized for the manufacturing whereby the package itself aids in high yield, error-free assembly and self corrected optical alignment attributes during the quality assurance process. The package is designed for high volume, low cost precision manufacturing to achieving the lowest commercial cost possible through the use of the minimum number of parts and inventive assembly/pre-assembly techniques.

BRIEF DESCRIPTION OF THE DRAWINGS

The features and advantages of the present invention will be better understood when reading the following detailed description, taken together with the following drawings in which:

FIG. 2 is a 3 dimensional (3D) view of a MEMS probe package according to an illustrative embodiment of the present invention;

DETAILED DESCRIPTION

Figure 1A:
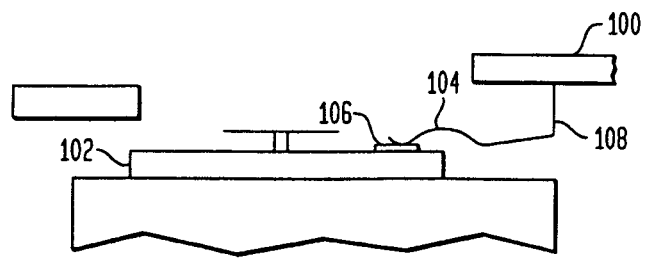
FIGS. 1A-1C are cross sectional views of spring contacts providing electrical connections to a MEMS die.
Figure 1B:
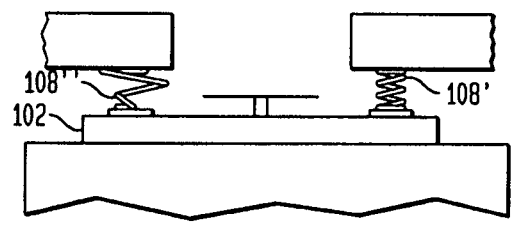
Figure 1C:
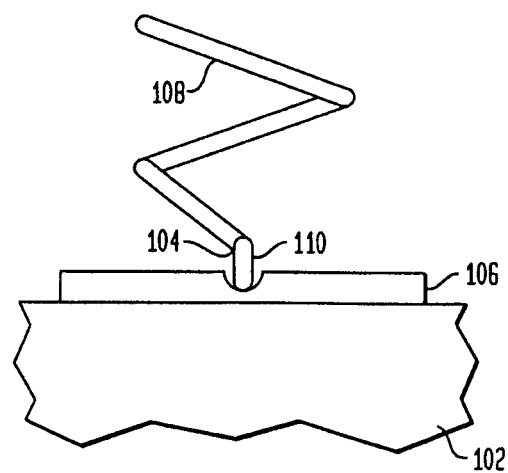

Most MEMS chips, like semiconductor chips, have bond pads that are used to connect the device to external components. These pads are typically between 50 um and 250 um long on a side. As shown in FIGS. 1A-C, conductive contacts 104 from external components can be held against the pads 106 by springs 108. Precise placement of both the MEMS device and the contacts 104 is critical to contacting these pads 106 properly, especially when the contacts 104 are on a separate piece that is contacting the MEMS die from above. In an illustrative embodiment of the invention, a specially designed plate 100 is placed on top of the MEMS die 102. This plate provides contacts 104 that connect to the pads 106 of the MEMS die 102. Techniques designed to contact a MEMS die 102 can also connect to the die via the inventive connection plate 100 structure. In the embodiment shown in FIG. 1A, the spring 108 comprises a leaf spring. Alternative embodiments include the use of a coil spring 108' and/or a spiral spring 108" as shown in FIG. 1B. A pit 110 may be provided in contact pad 106 to capture spring 108 as shown in FIG. 1C.

Wirebonding is a technique used for making a connection between a MEMS device and the package 200 as illustrated in FIG. 2. Typically bonds 202 have been made directly to the planarized ends of wires, however in many cases this has proven to be problematic. Copper wire 204 is difficult to planarize to a flat surface and is too soft to bond easily to. Therefore plates that are easy to bond to may be electrically connected to the wire tips.

Figure 3A:
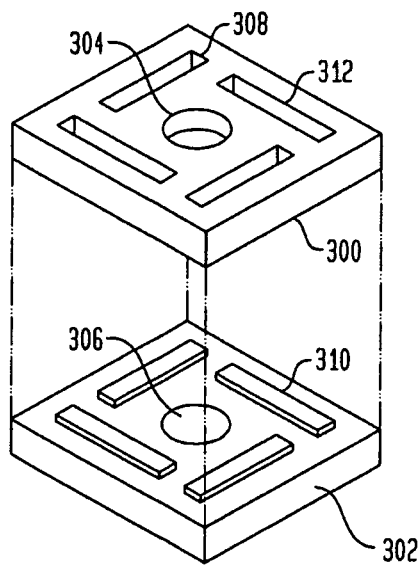
FIGS. 3A-3C and FIGS. 4A-4D are views of a MEMS adaptor plate assembled to a MEMS die according to an illustrative embodiment of the present invention.
Figure 3B:
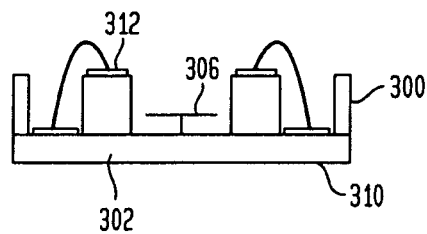
Figure 3C:
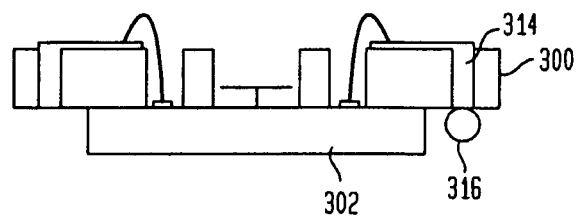

Wirebonding can also be used to connect the MEMS device to a contact plate as shown in FIG. 3A. A plate 300 is positioned on top of the MEMS die 302. The plate 300 has a hole 304 for the mirror 306, or a hole covered with glass, and a hole 308 on top of each bond pad 310. On top of the plate 300 are larger bond pads 312. Referring to FIG. 3B, bonds are made through the holes 308 in the plate 300 to the MEMS device and then to the larger bond pads 312 on the top of the plate 300. This protects the MEMS device while at the same time providing a larger bond area and optimized bond locations. If the plate 300 is larger than the MEMS device as shown in FIG. 3C, through plate connections 314 can be made to bond pads 316 placed around the die 302. Lastly, this protective plate can be affixed in advance of mounting the MEMS device in the plastic package. In illustrative embodiments, the plate may be made from a silicon wafer, a fiberglass (PCB). Alternatively the plate may be made from alumina, glass, sapphire, quartz, or injection molded plastic. Connections from the plate to the package may be solder bumps, conductive adhesive, and/or wirebonding.

The plate may be directly connected to the wiring or electrical traces on a thin flexible substrate. In this case, all connections to the MEMS device can be made prior to placing it in the package, thereby simplifying assembly. In some cases, it may make sense to affix the contact plate to the wiring in advance, then perform wirebonding after placing the MEMS device in the package.

Generally, contacts will be embedded into the enclosing piece or will be press fit into a pre-molded hole on the top piece. These contacts can be springs (flexible contacts) as shown in FIGS. 1A, 1B and 1C, or pins (semi-rigid contacts). Spiral springs, helical, and flexing pin springs are more complex to fabricate and install, but have the benefit of minimizing spring motion upon compression. Therefore, they tend to have a higher accuracy when engaging the pads on a die. In addition, because they have a pure axial motion, the spring can be mounted directly above the pad onto which it is contacting. In some cases, this minimizes the space required by the spring.

Leaf springs are used to contact the pads from an angle, as shown in FIG. 1A, and rely on pure lateral bending to exert force. Upon package closure, leaf springs 108 will not be located normal to the contact pad. Leaf springs 108 may contain a bend near the tip to facilitate contact with a pad. The leaf springs 108 may also be slightly curved along their length to better control the force they exert and how much the spring slides upon contact with the pads, but prior to full package closure.

Figure 4A:
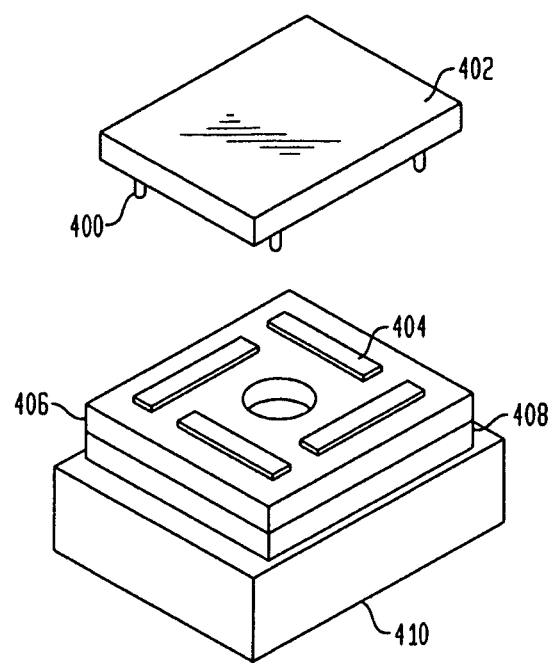
Figure 4B:
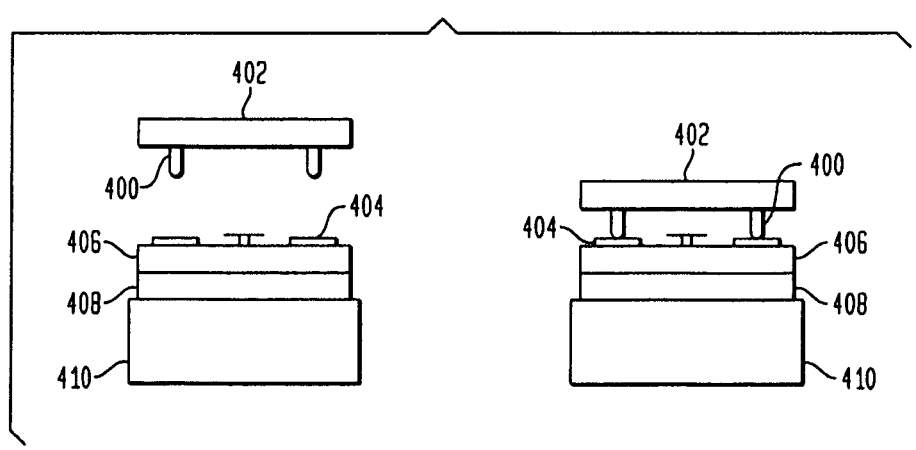
Figure 4C:
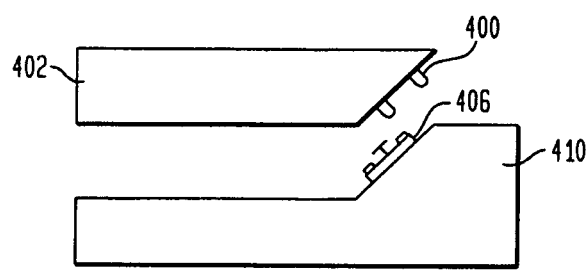
Figure 4D:
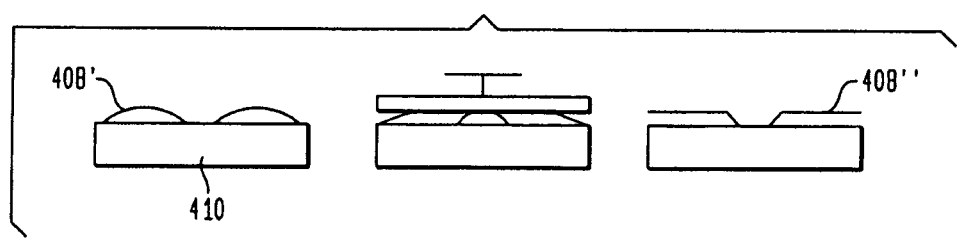

Pins 400 may extend from the top piece 402 and press against the MEMS device contact pads 404 as shown in FIGS. 4A, 4B and 4C. While it is possible that the pins will flex enough that contact to the MEMS device will be achieved for all pins, it is likely that this will stress the MEMS die 406. Therefore, the MEMS device may be mounted on a surface 408 that can be compressed. This compressive surface 408 may comprise specially molded plastic springs that support the die or may be made from foam, rubber or silicone, for example. In all of the above cases, the contacts may be machined out of silicon and may be metalized in a manner that is similar to the manner used to test semiconductors prior to packaging. The compressible surface 408 may itself be mounted on the bottom piece 410 of the package. FIG. 4D shows embodiments of the compressible layer 408 comprising molded plastic arches 408' or leaf springs 408".

To capture the spring or pin, the MEMS contact pad may have a pit 110 formed on its surface, as shown in FIG. 1C, that will allow for a more secure connection while minimizing slippage. The pad may be formed as a silicon pad that may be coated with aluminum to form a salicide for improved contact. Springs or pins may be coated with a conductive epoxy to improve connection strength.

Figure 5:
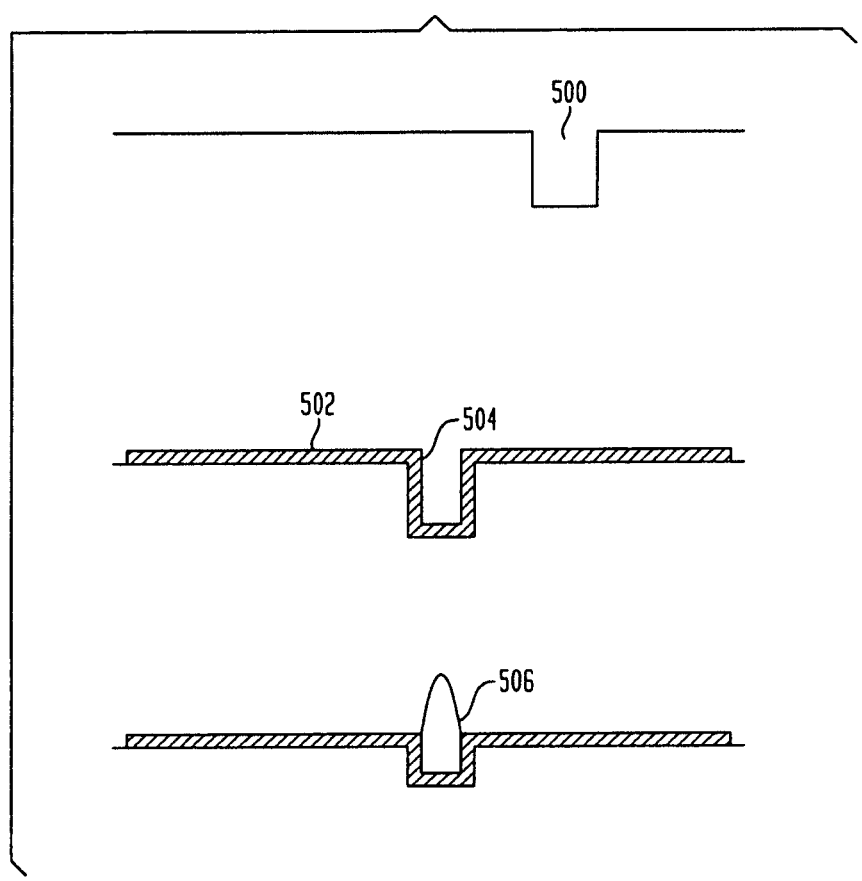
FIG. 5 is a assembly diagram of a metalized hole and pin according to an illustrative embodiment of the present invention.

Laser lithographic techniques may be used on molded holes 500 to create an electrically conductive path 502 to the hole 500 and a conductive surface 504 inside of the hole 500 as shown in FIG. 5. Pins or springs 506 pressed into these holes 500 will then be conductive.

Figure 6:
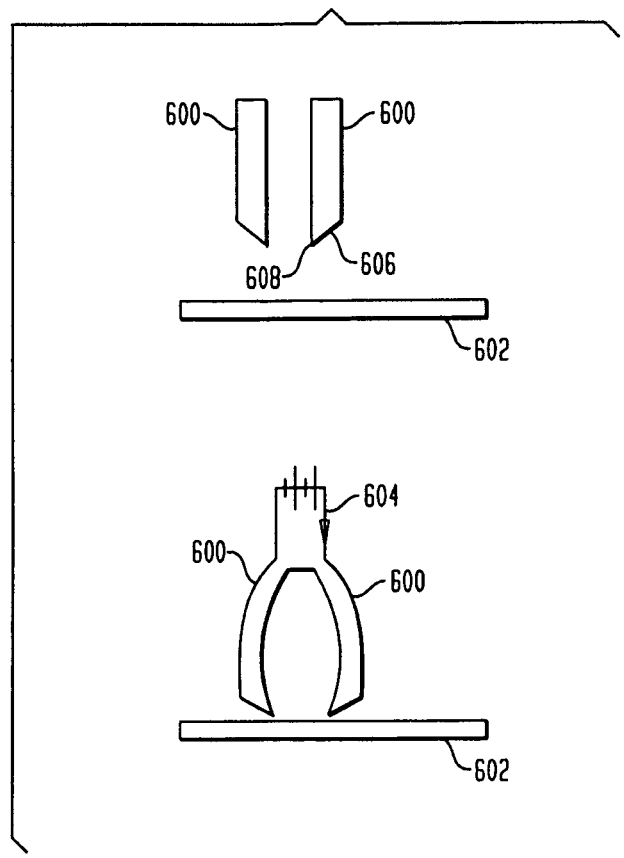
FIG. 6 is a schematic diagram illustrating a system of two contact bonding according to an illustrative embodiment of the present invention.

There may be two contacts 600 per MEMS device contact pad 602 as shown in FIG. 6. An electrical current 604 passed through the contacts 600 heats them and permanently bonds them to the MEMS pad 602. The contacts 600 should be tapered 606 near the contact point 608 to increase the temperature there relative to the rest of the pin or spring contact 600. Additional profile shaping may be used to further increase the performance of this method. The two pins may be positioned close to each other wherein, by angling the tips properly, the pins will flex outward and not touch upon contact with the pad.

This method of heating between two contacts may be used in conjunction with ultrasonic welding, which may improve the adhesion and bonding properties of the contacts. The materials used for this type of bonding can include, but are not limited to: tungsten, aluminum, silver, gold, platinum, copper, tin, and tin/lead solder, as well as alloys of these materials and conductive epoxy. It may be advantageous to use one material for its mechanical properties and another for its electrical properties. In this case, the pin or spring may consist of one material that is then coated or plated with another metal layer or layers. An incomplete list of materials for the structural layer include tungsten, aluminum, silver, gold, platinum, copper, titanium, iron, stiff polymers and steel, as well as alloys of these materials. The additional layer or layers may consist of, but are not limited to, tungsten, aluminum, silver, gold, platinum, copper, tin, and tin/lead solder, as well as alloys of these materials.

Figure 7A:
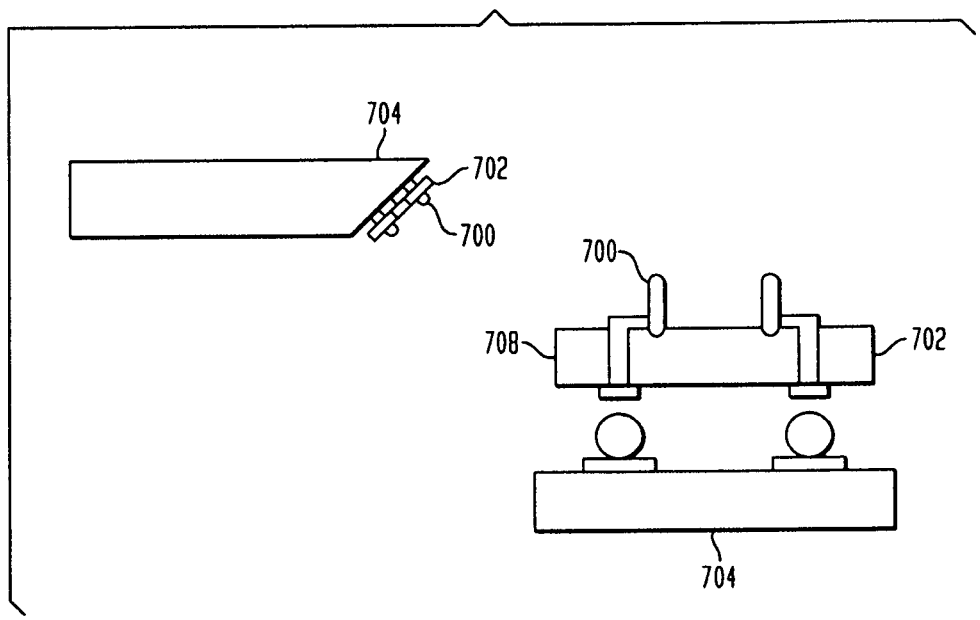
FIGS. 7A-7C are views of a MEMS package using keyed contact pins according to an illustrative embodiment of the present invention.
Figure 7B:
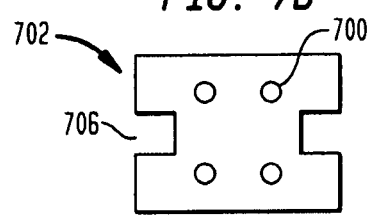
Figure 7C:
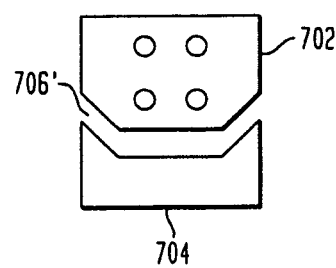

Referring to FIGS. 7A, 7B and 7C, the contact springs or contact pins 700 may be on a separate plate 702 that is placed on the enclosing part such as package top 704. The plate 700 may be silicon and may be micro-machined to form springs or pins. Alternatively, the plate 700 may be plastic or some other easily molded material. The plate may also be quartz, ceramic, metal, or some other machined material. The plate 700 may also be made from fiberboard or carbon fiber. The plate may be keyed or notched 706, 706', as shown in FIGS. 7B and 7C, to facilitate proper alignment with the enclosing part. The plate may have through plate interconnects 708 and be bump bonded to the plastic package or it may be soldered or wirebonded to connect it to the rest of the package. In addition, other wiring components and/or subassemblies for the package may connect directly to the plate. This would be especially advantageous in the case where wires are printed on a thin flexible substrate. The plate could be affixed to the thin flexible substrate using standard techniques prior to assembly of the package.

Figure 8:
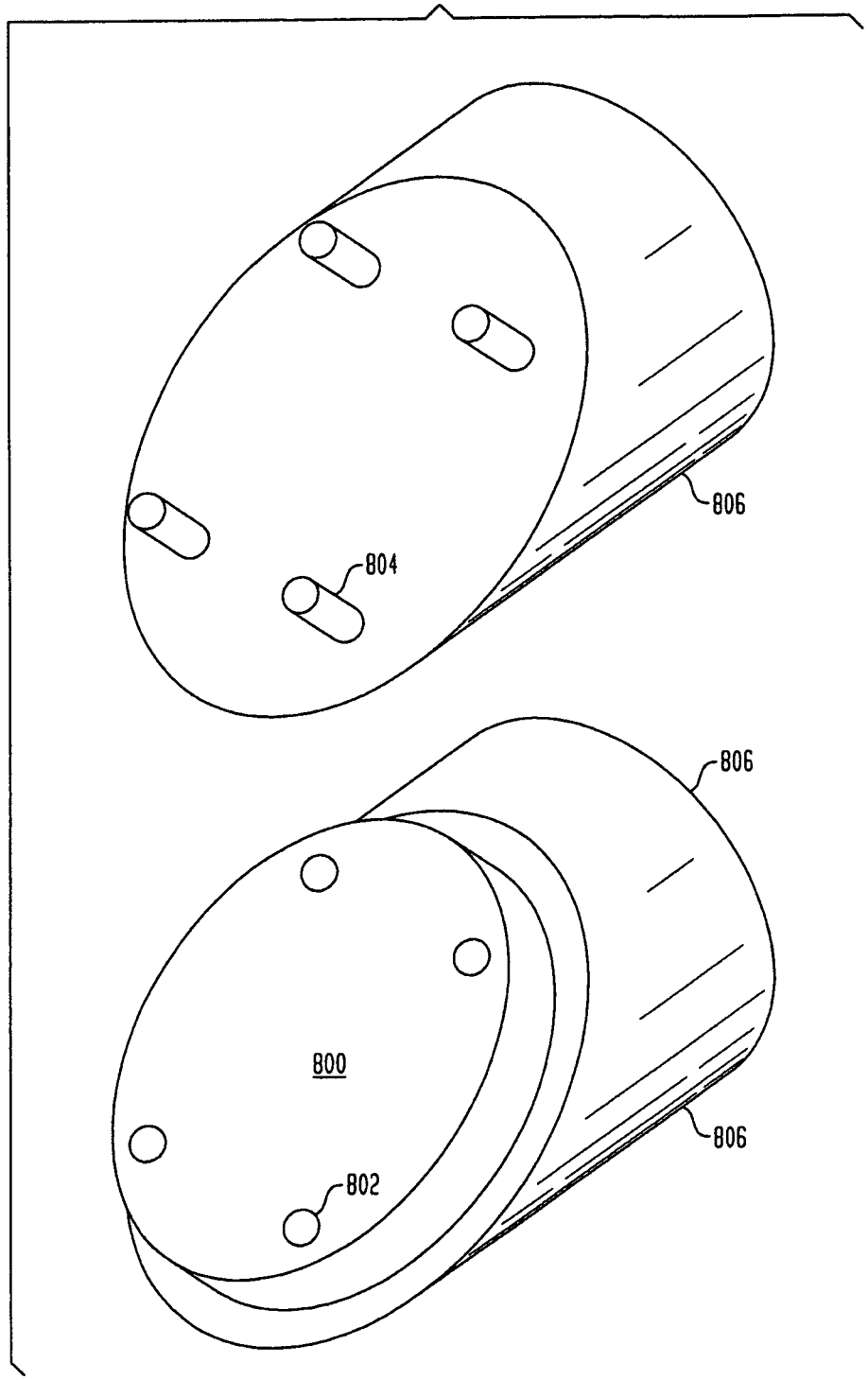
FIG. 8 is a 3D view of a post and hole mounting system for MEMS dies according to an illustrative embodiment of the present invention.

Referring to FIG. 8, the MEMS die 800 can have notches or holes to align with conductive pins or metalized plastic pillars 804. These pins or pillars 804 can pass through the notches or holes 802, providing alignment for the MEMS device 800, but also may provide contact pads to connect the MEMS device with the rest of the package. The MEMS device 800 can be wirebonded to the pins and pillars 804, thereby greatly reducing the amount of space required for wirebonding. The MEMS device 800 can also be attached to the pins and pillars 804 using conductive epoxy. Alternatively, the MEMS device 800 can be attached to the pins and pillars 804 by contact fit or the pins and pillars 804 can be routed through the MEMS device 800 and then melted into place.

The holes or notches on the MEMS device 800 can be created a number of different ways as part of the fabrication process or during a dicing process using a modified laser scribe, for example. Backside dicing using deep trench reactive ion etch (DRIE) can also be used to create the holes or notches. Beams can be left to hold the dies together and later the beams may be cut using a laser, for example.

Through-wafer interconnects can be used to attach a MEMS device to the package. By employing through-wafer interconnects, the packaging footprint requirements can be further reduced. A through-wafer interconnect provides an isolated path from the contact pads in the device layer to the backside of the wafer using a metal or heavily doped semiconductor plug. The backside contacts pads on the die may then be connected to the package pads directly using a conductive adhesive, epoxy, metal-metal compression bonding, thermal bonding or soldering.

Figure 9A:
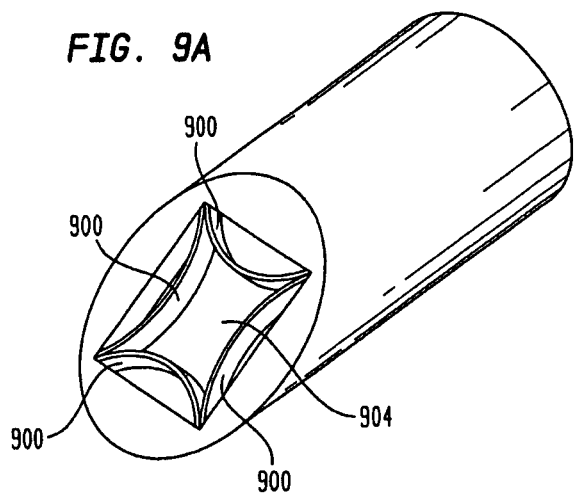
FIGS. 9A-9C are views of a MEMS mounting package having a pocket and alignment springs according to an illustrative embodiment of the present invention.
Figure 9B:
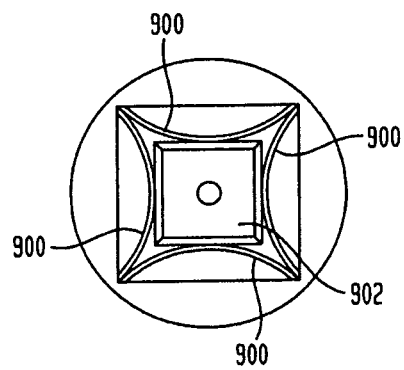
Figure 9C:
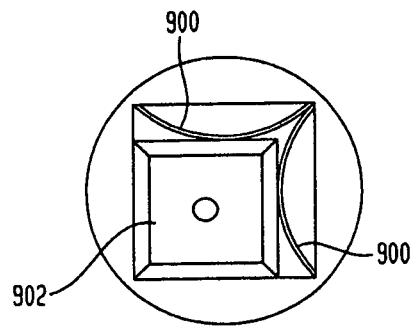

The correct placement of the MEMS die is of critical importance to maintaining the alignment of a MEMS system. Referring to FIGS. 9A, 9B and 9C, the MEMS die 902 can sit in a pocket 904 that is roughly the same shape as the die 902. Good alignment can be obtained by reducing the clearance of the pocket as much as possible. If there is some movement, a test laser aimed through the optics can be used to assist proper mirror placement. Springs 900 on a side of the pocket 904 can be used to help center the die as shown in FIG. 9A. This allows for some variability in shape and size of the die 902 and/or pocket 904. One arrangement shown in FIG. 9B contains 4 springs that all push the die towards the center of the pocket 904. When the pocket 904 is slightly larger than the die 902, this provides a passive method of centering the die without manual test and movement. Another arrangement shown in FIG. 9C, contains two or three springs 900 and two or one solid walls respectively. The principle is the same as the four spring embodiment, but the walls provide fixed points of reference and therefore even better alignment markers. The springs 900 can be molded out of plastic or added in as separate pieces, for example.

As mentioned above, pins or pillars can be used to properly position a die that has been notched or fabricated with holes, even if the posts are not conductive. For alignment purposes, a through-wafer pin or pillar is not required. Smaller ridges or bumps may work as well. One method of making a MEMS mirror requires that a large hole is left in the back of the die. This hole can be used as for alignment purposes. A small ridge or mesa in the MEMS mounting surface may provide enough alignment structure to allow the die to simply snap into its proper location.

Figure 10A:
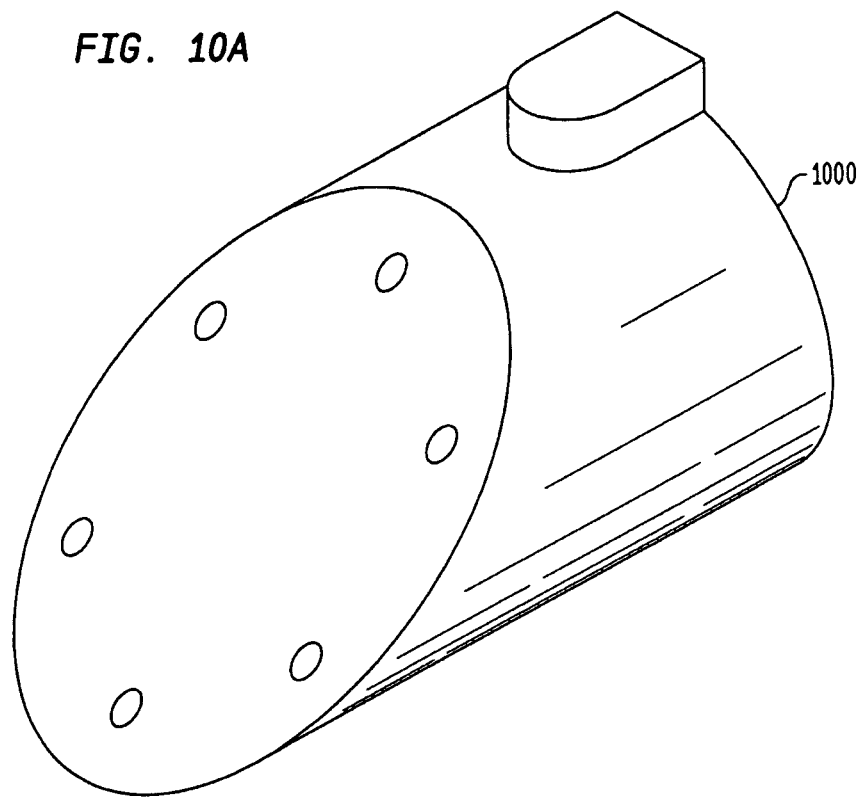
FIGS. 10A-10B are 3D views of two parts in a three part MEMS mounting package according to an illustrative embodiment of the invention.
Figure 10B:
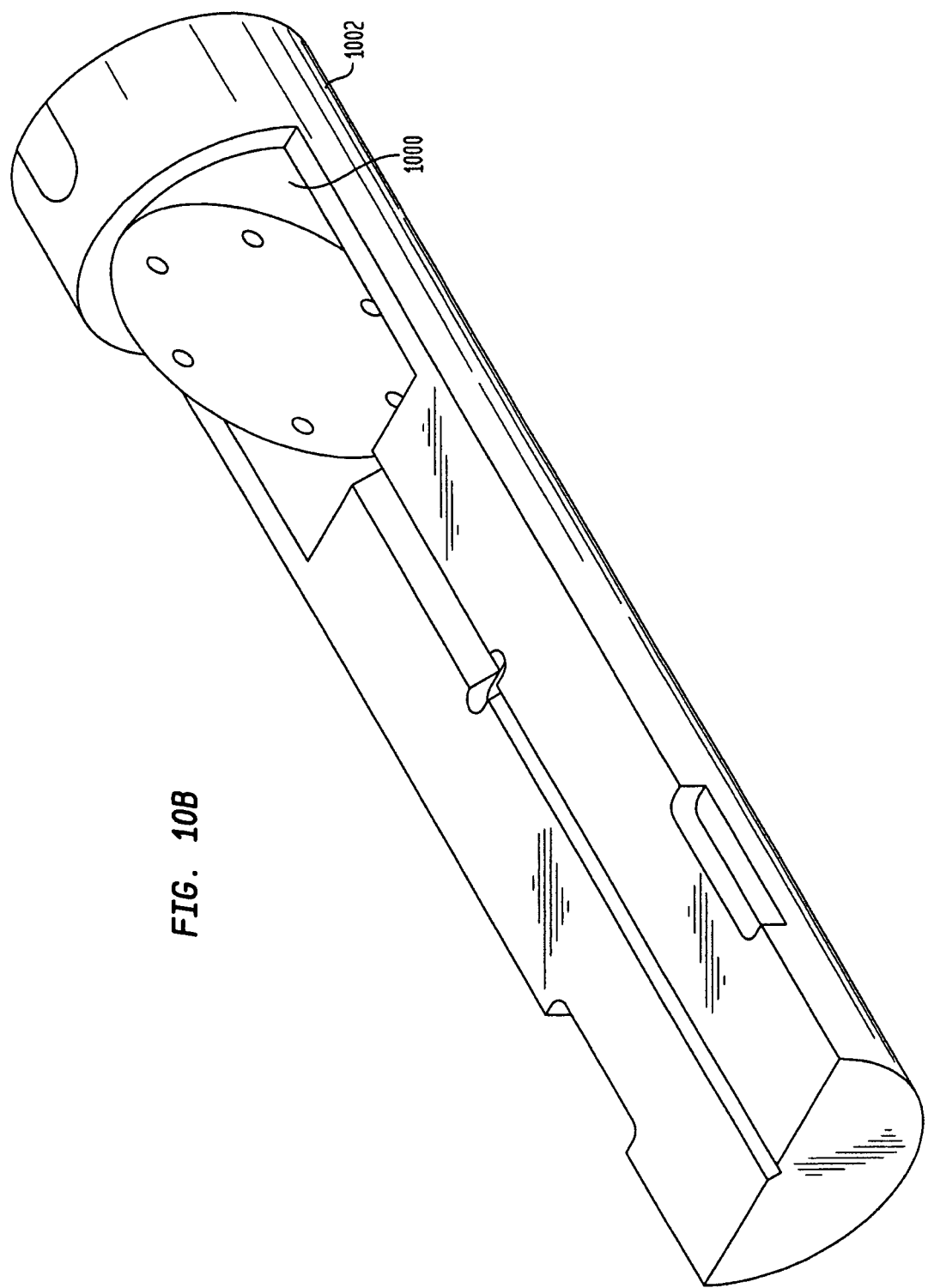

In one embodiment, MEMS mounting surface is disposed on a separate plastic "plug" 1000 shown in FIG. 10A that slots into the back of the package 1002 as shown in FIG. 10B. This plug 1000 can be pre-wired in order to ease assembly. For example, the MEMS device may be wirebonded and attached to the plug 1000 prior to assembly of the plug 1000 to the package 1002. Alignment of the MEMS die on the plug 1000 may be easier to achieve while the plug 1000 is external to the rest of the package 1002. In addition, the plug 1000 can serve as a test platform for additional tests. The plug 1000 can be flat or have a pocket subject to all the design considerations discussed above.

Figure 11A:
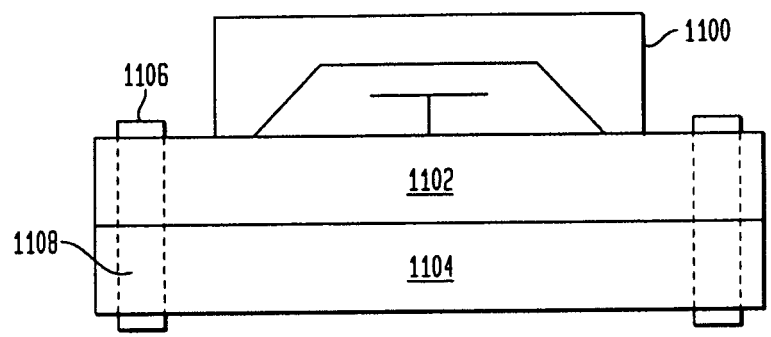
FIGS. 11A-11B are cross sectional views of a MEMS die mounting system having a clear protective cover encapsulating the MEMS die according to an illustrative embodiment of the present invention.
Figure 11B:
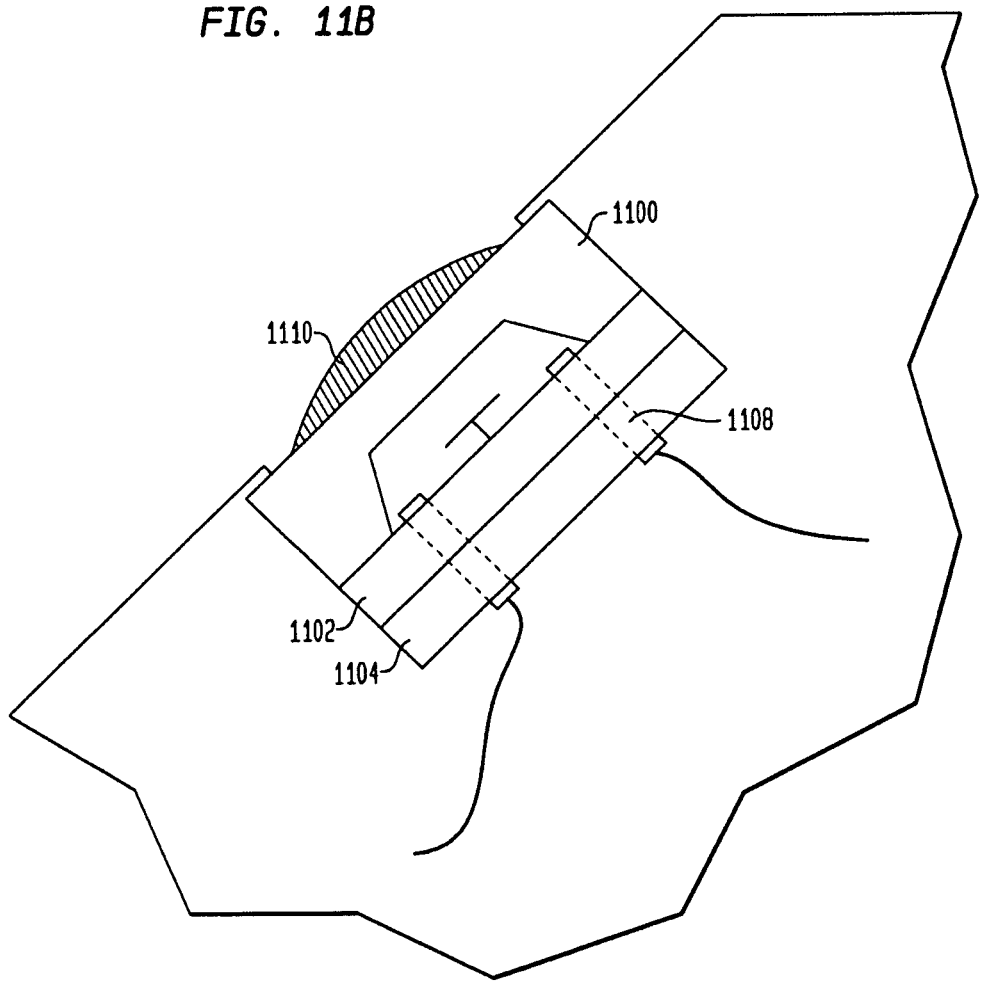

It is possible for a MEMS die or any other imaging element, including CMOS, to be molded directly into polymer during a molding process. This can have many benefits for packaging, including reduced manufacturing time and cost, very precise positioning of the die, the ability to protect the device prior to assembly, and a more durable probe. In addition, when used with double shot molding, all wiring can be accomplished during the molding process. The MEMS die must typically be sealed prior to injection molding. Referring to FIGS. 11A and 11B, this can be accomplished by bonding a clear protective substrate cover 1100 to the top of the die 1102 and bonding any protective layer 1104 to the bottom of the die 1102. The protective substrates 1100, 1104 may have topology that accounts for the topology of the die. The protective substrates 1100, 1104 may contain interconnects 1108 themselves, either through wafer or patterned on the surface as shown in FIG. 11C. The protective layer 1100 may be smaller than the MEMS die to facilitate access to the die bond pads 1106. A lens can be molded over the device, alleviating the need for an external lens as shown in FIG. 11B.

Interconnections to the device may be accomplished using springs, pins, wirebonds, for example. Traces on the substrate may be achieved using lithographic, electron beam, and laser beam methods to pattern metal using a photosensitive layer.

In an illustrative embodiment of the invention, the package itself can be used to contain the signal paths required for device operation. This is a departure from how the majority of electronic devices work. In most other devices, the molded packaging acts as an exterior barrier while other special purpose substrates and wires are used to conduct signals. For example, most electronic components are mounted on a printed circuit board (PCB) which provides conductive layers for signal routing. The completed PCB is then placed in an enclosure that provides protection from the environment.

The problem with this method of packaging is that it is not efficient in terms of area or volume. The PCB itself may be nearly as thick as some of the packages required for MEMS devices. In addition, PCBs do not lend themselves to complex geometry. Achieving alignment between multiple components may necessitate multiple boards mounted in different locations in an enclosure. This further increases the minimum size of a device that can be constructed.

Illustrative embodiments of the invention provide wiring techniques for MEMS devices in optical coherence tomography (OCT) probes. For such applications, the inventive package advantageously protects the MEMS device from its operational environment. The package is also space efficient, can handle large voltages used by electrostatic MEMS systems and is able to work with non-planer geometries.

Figure 12:
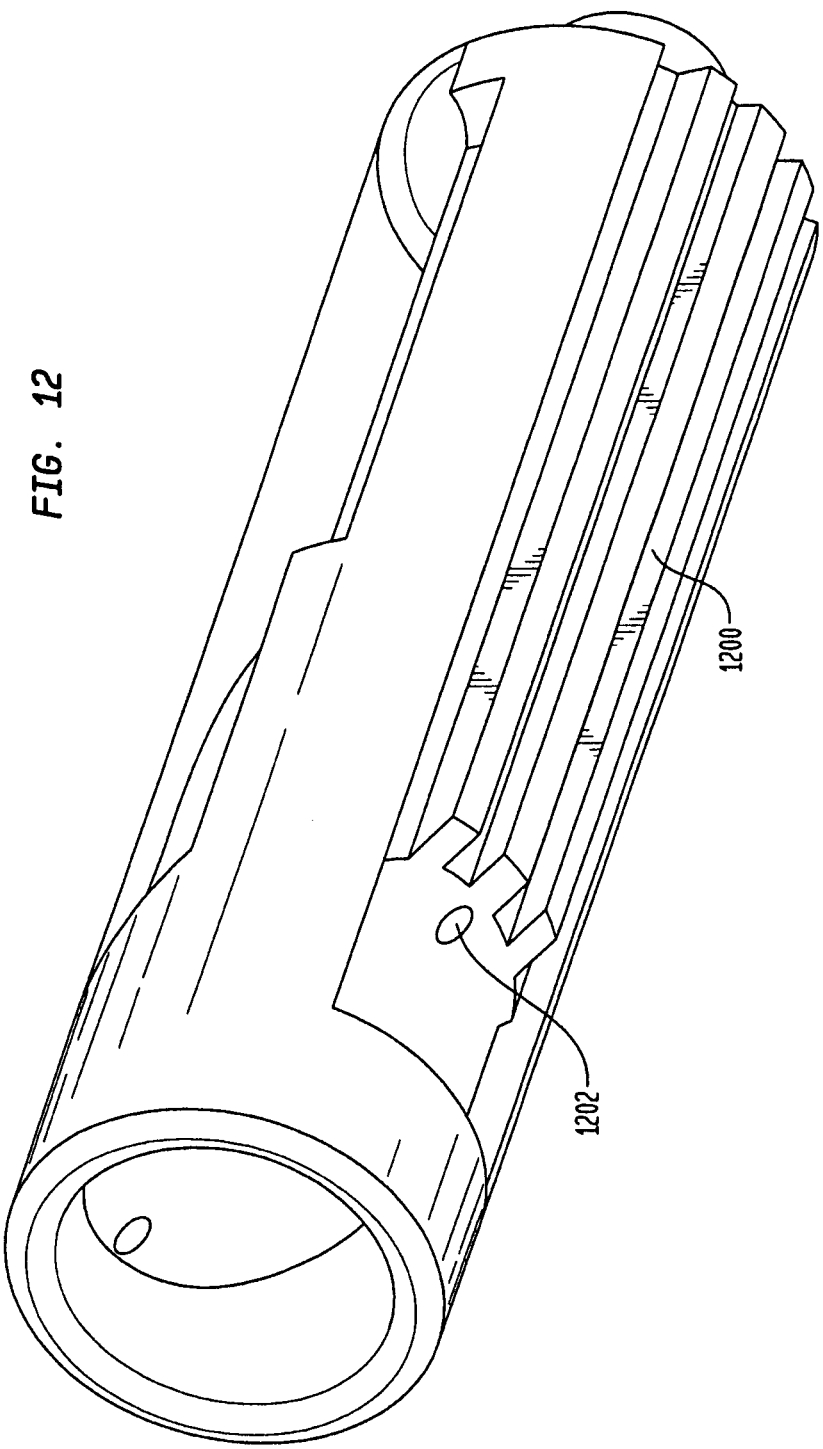
FIG. 12 is a 3D view of a MEMS mounting package having wiring channels according to an illustrative embodiment of the present invention.

Wires can be used to route the signals. Copper, silver, aluminum, gold, or any other conductive wire of small diameter (<0.5 mm) can be used in conjunction with a properly designed package. The wire(s) can be routed outside of a package or package component or may be routed through the package or molded into the package itself. With reference to FIG. 12, in the case of external routing, the wire is generally placed in channels that fit one or more wire as shown in FIG. 12. The wires can then be confined to the channel using adhesive, tape, shrink tubing, or other methods. Frequently, the wire used for external wire routing will be insulated, such as epoxy coated magnet wire. Other methods of guiding a wire include holes 1202 and slots through which the wires pass, notches for the termination of wires, and conductive adhesive for wire connections.

Figure 13:
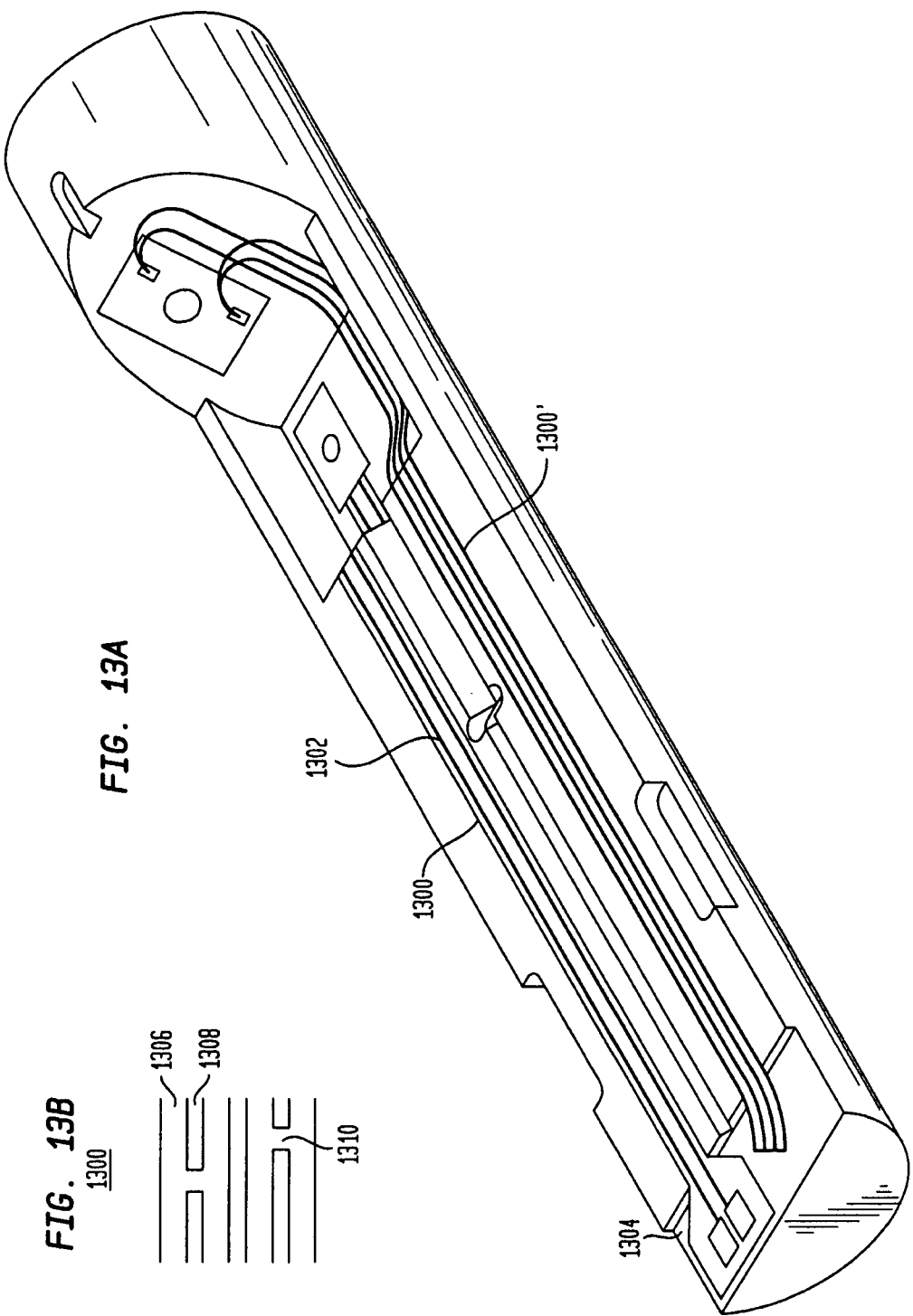
FIG. 13A is a 3D view of a MEMS mounting package including a flexible circuit conduits according to an illustrative embodiment of the present invention.
FIG. 13B is a cross sectional view of a multi-layer flexible circuitry according to an illustrative embodiment of the present invention.

Referring to FIG. 13A, signal conduits can be metal lines 1302 printed on a thin flexible substrate 1300 or may be provided as metal traces in a polyimide tape 1300' for example. The lines 1302 can then soldered to wires external to the package at solder pads 1304 as shown in FIG. 13A. The thin flexible substrate 1300 may be made of the following materials: polyimide, polyester, su-8, resist, nylon, plastic, epoxy, rubber, polypropylene, polyfin. The thin flexible substrate may consist of multiple layers of metal 1306 and insulating materials 1308 with interconnects 1310 between the layers as shown in FIG. 13B. In this case, the wire routing can be complex with routing occurring across many layers. The thin flexible substrate 1300 may be printed on both sides with interconnects through it 1310. The thin flexible substrate 1300 can also consist of a tape with adhesive on one or both sides or it may be glued or held in place during the assembly process. The thin flexible substrate 1300 may provide wiring to small surface mount components directly on the substrate 1300. These surface mount components can provide a number of functions to the overall assembly such as RFID, serial number, coded lockout, status chip, fuse/protection, camera, inertial devices.

In an alternative method of creating signal paths on a package, a polymer impregnated with metal particles can be molded to a desired shape, then laser ablation can be used to expose the metal particles while at the same time roughening the surface. An electrolyses plating bath can then be used to metalize the regions of exposed metal particles.

Metal lines can also be created directly on the surface of many polymers through the modification of the surface hydrophobicity of the plastic. One way to accomplish this is to coat the part with a surface modification substance or a self assembled monolayer. This may involve the use of multiple layers with differing adhesion strengths and surface properties. The layers are ablated to make the wiring pattern through the use of an energy beam such as an electron beam, a laser, or high energy light passed through a mask. The part is then dipped in a bath containing a solution consisting of a solvent and metal based micellae. The solution will bead into lines and once the solvent evaporates, the metal micellae will be deposited. These metal deposits can then be used as the seed layer in an electroplating or electroless plating process.

Figure 14:
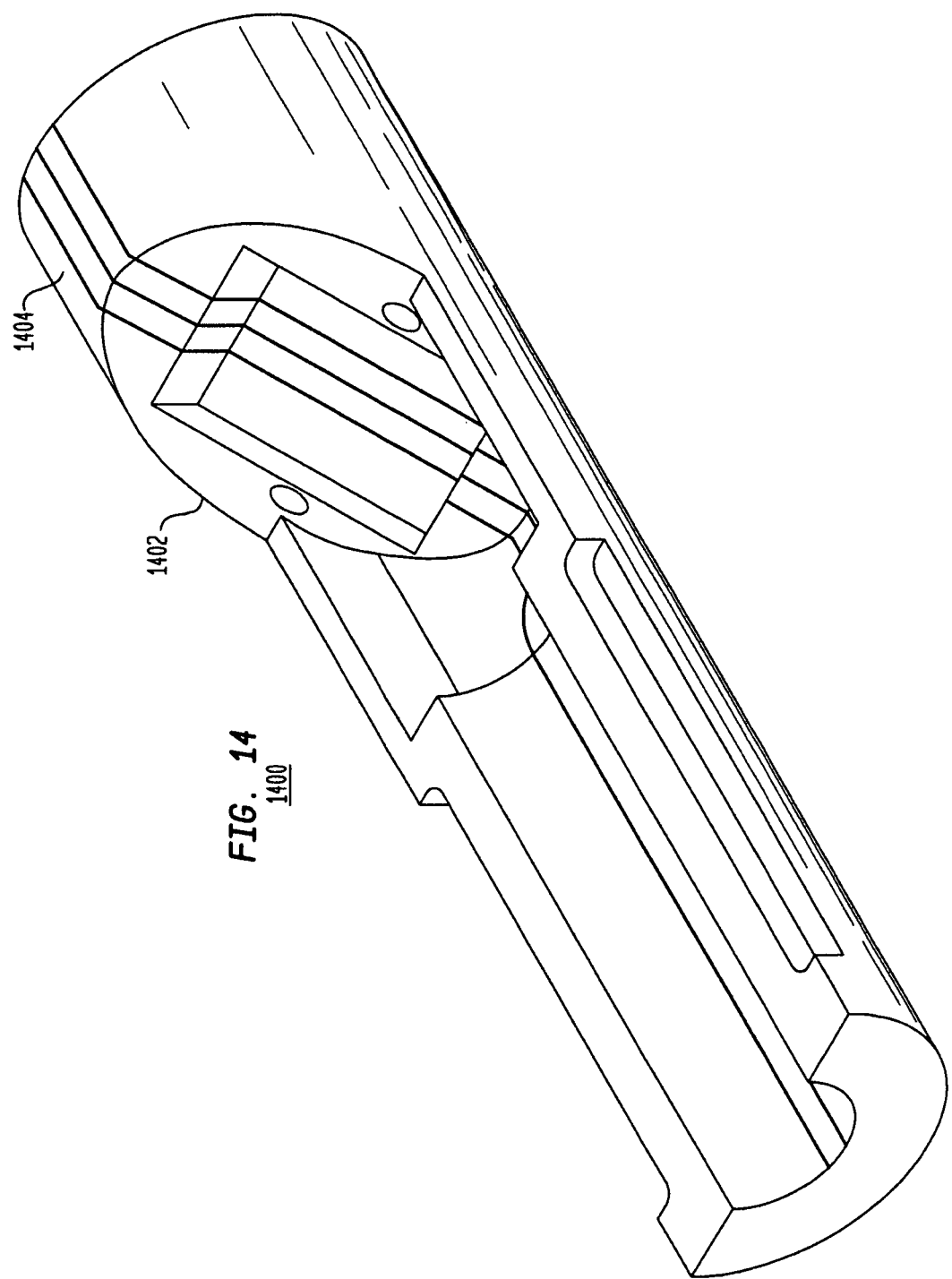
FIG. 14 is a 3D view of a MEMS mounting package having conductors sandwiched in the package material according to an illustrative embodiment of the present invention.

In embodiment described with reference to FIG. 14, the package 1400 can be machined out of a repeating insulator 1402 and conductor 1404 "sandwich" or may be molded to be a repeating insulator and conductor "sandwich" as shown in FIG. 14. This provides a number of electrically isolated contacts anywhere the molded surface intersects a conductive plane.

Figure 15:
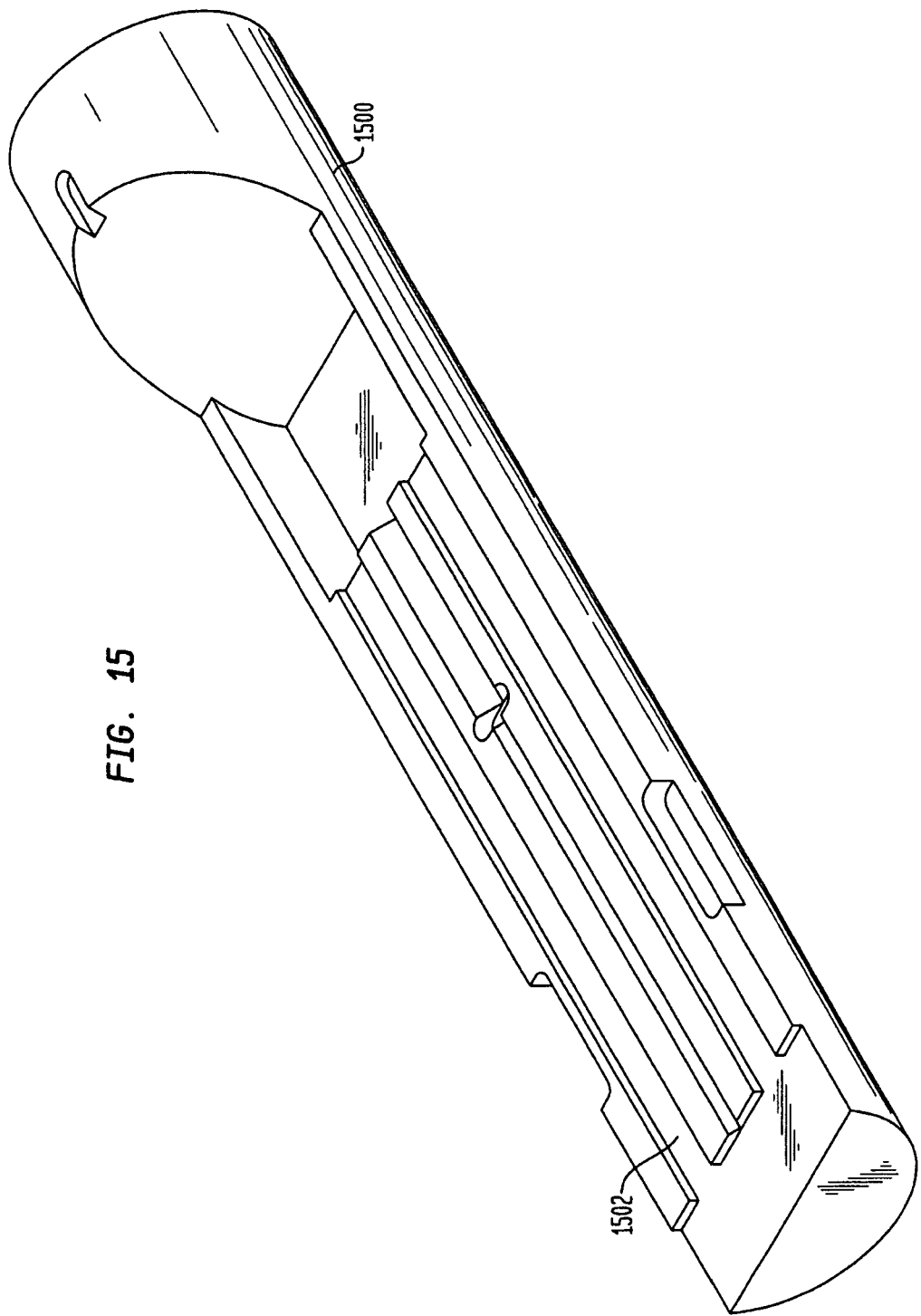
FIG. 15 is a 3D view of a MEMS mounting package having channels for a flex circuit disposed thereon according to an illustrative embodiment of the invention.
Figure 16:
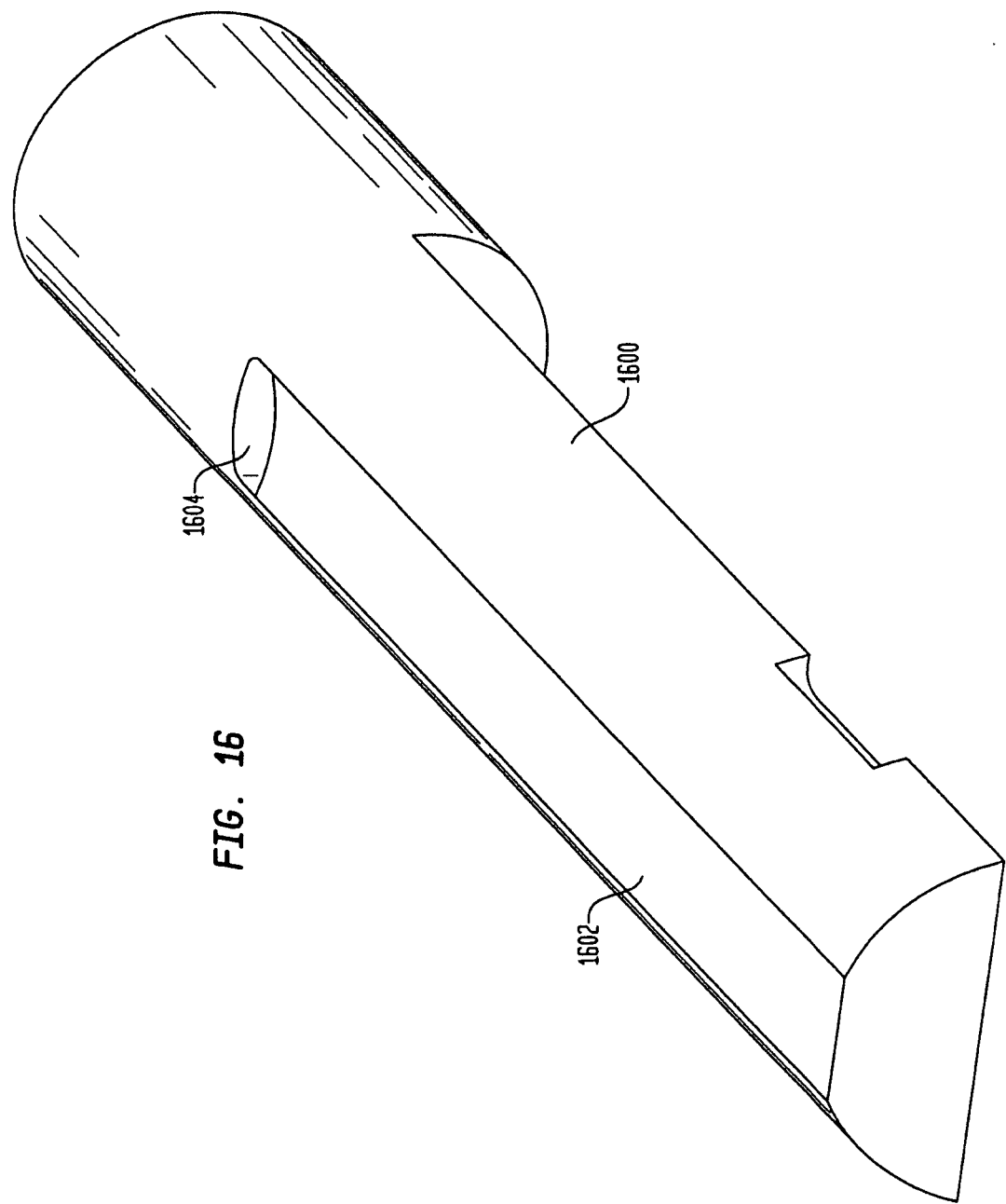
FIG. 16 is a 3D view of a MEMS package having a flat surface and a feed through hole adapted for receiving a flexible circuit conduit according to an illustrative embodiment of the present invention.

The above wiring techniques can be used on a variety of packages, for a number of different devices. For example, as shown in FIG. 15, wiring can be routed in channels 1502 inside the package 1500, alongside a gradient index ("GRIN") lens, closely following the contours of the package. It can eventually be routed to the MEMS die for wire bonding, conductive adhesive or contact connections. As shown in FIG. 16, wire routing for flexible substrates can also be provided along the bottom 1602 of the probe on a flat or slightly curved side of the package 1600. A slot 1604 in the bottom then is used to route the flexible substrate lo the interior of the package. Wire routing for wires can also be provided in trenches along the bottom of the package. The wires can be routed through a slot to a hollow area behind the die and then through holes next to the die. The wires can be secured in place using epoxy or another adhesive.

In one embodiment, the wires are mechanically planarized to the plastic surface and then wirebonds are performed directly to the wires. This flattening process can include milling, the use of a plane, sanding, or other mechanical techniques. In another embodiment, plates are glued to the wire tips using conductive glue. These plates then become the bond pads for wirebonding. To aid glue distribution, the wire may not be even with the surface, but instead may be in a depression or well that controls the ability for the glue to spread. In addition, the well allows the conductive plates to contact the package in only a limited number of places. This compensates for surface roughness that may have been created by the planarization process on the wires. In yet another embodiment, the plates are embedded into the surface of the plastic prior to wiring using molding techniques such as double shot molding or through the creation of a recess into which the wires can be placed manually. The plates can be made of a number of materials including aluminum, silicon, gold, silicon coated with aluminum, silicon coated with gold or other thin conductive material.

Figure 17:
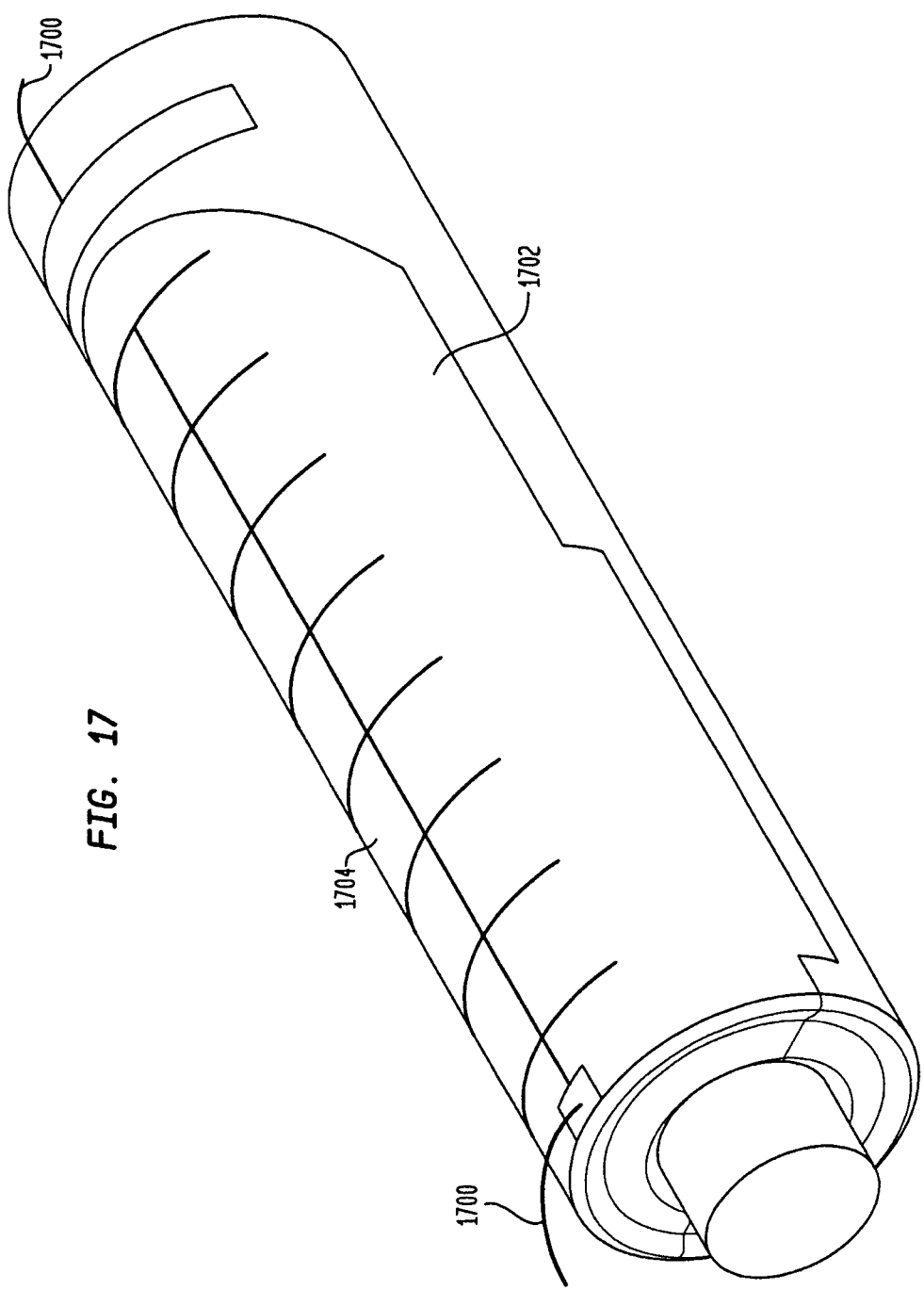
FIG. 17 is a 3D view of a MEMS package assembly having grounding conductors disposed on an external surface.

The wiring techniques discussed above can be used to eliminate static buildup on the package. Static charge is very dangerous to MEMS devices, causing unintentional device movement and possible unintended contact or static discharge that can ultimately destroy the MEMS device or any other electronics present. This as a particularly important issue because many of the packaging designs discussed in this document are based upon non-conductive plastics. In an illustrative embodiment described with reference to FIG. 17 uninsulated ground wire 1700 can be held next to the package 1702. The ground wire 1700 can be held in place using conductive tape or conductive epoxy. This will eliminate much of the charge buildup. When signal pathways 1704 are etched or plated directly on the package 1702, lines can be printed on the inside and outside surfaces of the package, eliminating charge. The plastic package 1702 can also be encased in a metal sheath in order to eliminate charge buildup.

A window is a primary conduit through which the OCT system interacts with the environment and is typically the last optical element prior to the exterior. The window is therefore the furthest outboard location on a package that a lens can be located. A shutter is an optical element that can very easily be molded into the packaging. The environment where an OCT probe must function contains mucus which has a tendency to accumulate on the window. Removing mucus from optical probes inside the body has been a long standing problem for medical device designers. Illustrative embodiments of the invention include minimizing the effect of mucus, particulate matter, and wet matter that occludes the window.

Figure 18:
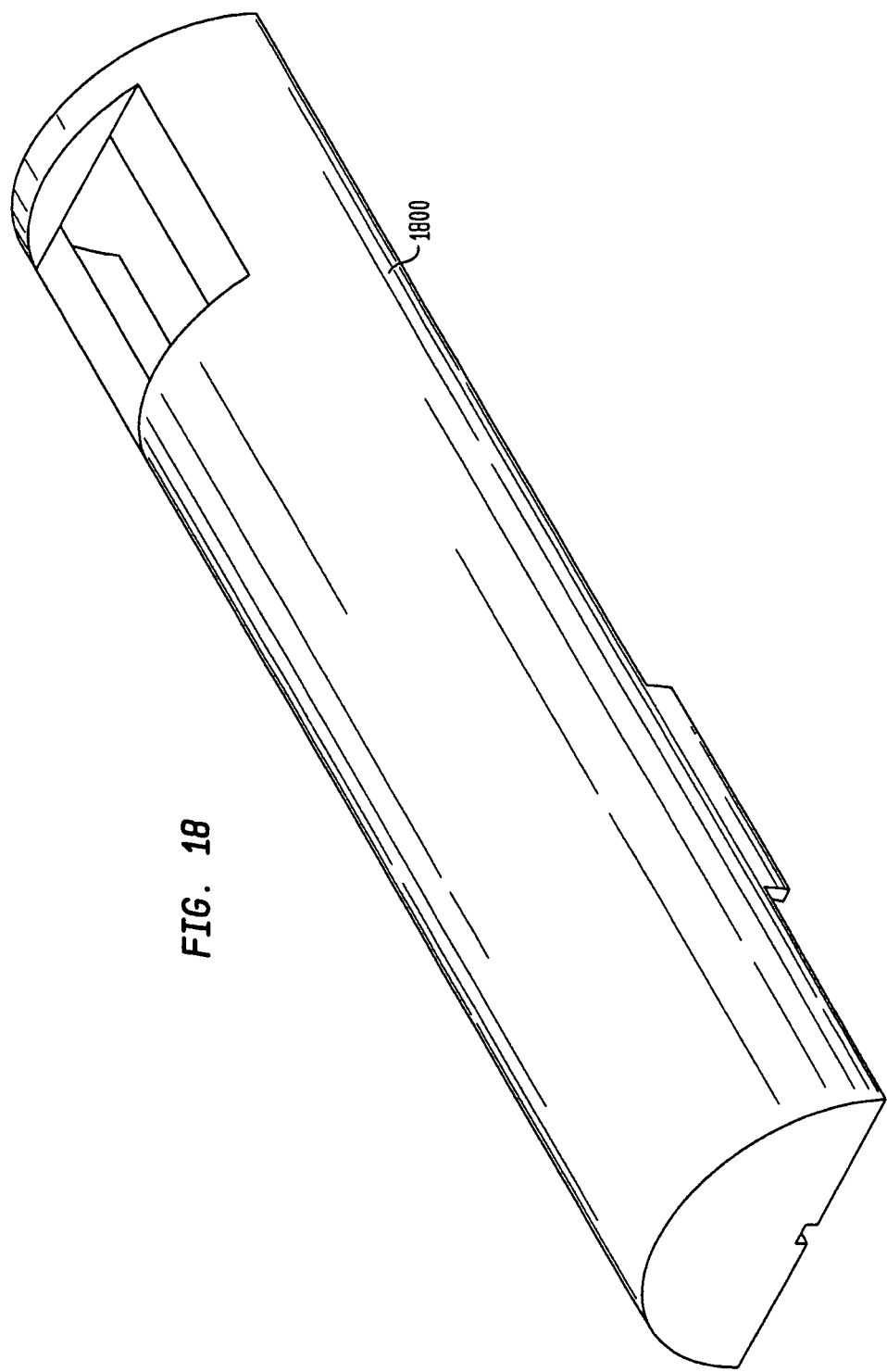
FIG. 18. is a 3D view of a MEMS package adapted for receiving a window according to an illustrative embodiment of the present invention.

Referring to FIG. 18, a window can be molded as part of the package 1800 through double shot molding or by using a clear packaging material, such as polycarbonate, which can be molded over an opening 1802 in the package 1800 to form a window. Alternatively, the window may be fabricated as a separate piece that is attached later in the assembly process. In this case the window can be any material such as glass, quartz, clear polymer, or a very thin polymer sheath or virtually any material that is transparent to the light sources being used. The window may also have a coating such as an antireflective layer.

In order to control the build up of mucus, particulate matter, and wet matter on the window, it can be made with hydrophobic surface portions, thereby reducing the adhesion of the mucus to the probe. This hydrophobicity can be an intrinsic property of the material used for the window. Alternatively, a coating can be applied to the window by a dipping, evaporation, or the deposition of a self assembled monolayer. In an illustrative embodiment, the window surface include a micro/nano pattern of hydrophobic channels that can be used to route a cleaning liquid such as water. The channels can be hydrophilic while surrounding areas are hydrophobic, to better guide water. This can be accomplished by depositing a surface changing material using a demascasene process, for example. A coating can be applied and then removed selectively with a laser to create these channels. Alternatively, the window can have other micro/nano patterns that can alter surface properties. For example, the window can be sacrificial (dissolve) or have sacrificial layers causing the top layer to continuously degrade and expose the fresh window underneath. The window surface may also biodegrade with UV light from device.

The window may be molded in a package to form the lens, or a lens of a second material can be added to the package. Molding a window of the package to serve a second function as an optical lens has the advantage of allowing the integration of post-scan objectives without significantly enlarging the physical size of the package. The post-scan lens may serve to expand the scan area or further focus an optical beam. In addition, for multi-modal imaging and imaging which require multiple wavelengths, chromatic corrections may be incorporated in the window. The lens can be chromatic or achromatic, spherical or aspherical and may have an antireflective coating.

In an illustrative embodiment, the package provided by the present invention maintains alignment between optical elements. The design of a lens mount is very important to maintaining this alignment. In addition, the package itself may be designed to function as the primary lens in the system, for certain applications.

Figure 19:
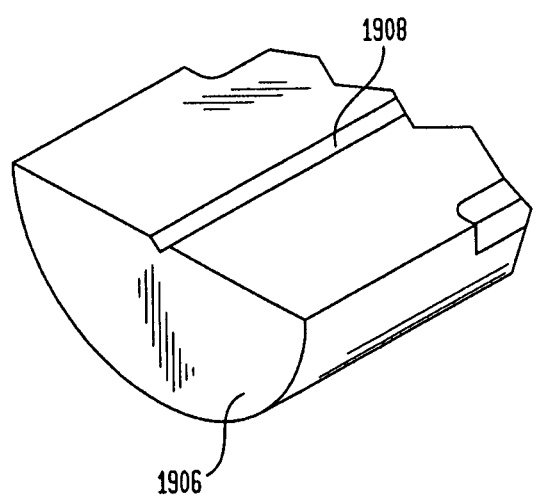
FIG. 19 is a 3D view of a three-piece tube assembly holding a GRIN lens according to an illustrative embodiment of the invention.

Referring to FIG. 19, a GRIN lens is held in a two piece tube assembly that consists of a top piece (not shown) and a bottom piece 1906, each with a channel 1908. When the top piece and bottom piece 1906 are pressed together they effectively hold the lens in place. The lens support channel 1908 can be a v-groove as shown or may have a square profile, for example, in order to control the number of points in contact. Alternatively, the lens support channel can be semicircular and support the entire length of the lens. The lens can be made in a number of different shapes including a cylindrical lens or a ball lens, for example.

The GRIN lens may alternatively held in a single tube assembly. The tube may have an insert that fits into one side to compensate for the draft angle in the case where the tube has been molded out of polymer. The tube can have smaller diameters that contact the lens at the ends and a large clearance through the rest of the channel. This may be advantageous in the case where an insert is used. In yet another embodiment, rather than add a lens, the package itself may be molded to serve as the lens. This would reduce the parts count of the package assembly and may improve the assembly process.

Normally, microelectromechanical (MEMS) devices are packaged in a gaseous environment of air or nitrogen at a pressure of about 1 atmosphere or less. For optical devices it is important to protect the optical surfaces, moving components and actuators from contamination, condensation and particles, thus a hermetic or near hermetic seal is employed. In some cases optical MEMS (OMEMS or MOEMS) are also packaged in a vacuum. An illustrative embodiment of the invention replaces the gaseous environment of a MEMS device with a fluid environment.

Replacing the atmospheric or low pressure gaseous environment with a fluidic environment has several important optical, electrical and mechanical advantages. Optically the refractive index of the fluid may be selected to match the index of the lens system, thereby reducing dispersion and reflections. Typically, MEMS components operating in air are under damped. While this is desirable for some systems, under damping causes mechanical overshoot and ringing in most MEMS devices, resulting in longer settling and tuning times. In under damped systems, externally applied accelerations and shocks may also generate undesirable oscillations and noise. The inventive fluid environment of MEMS device provides mechanical damping. Critically damping or over damping the device's fundamental mode greatly reduces the affects of external accelerations and can improve the tuning response time. In addition, the increased dielectric constant of the fluid relative to air provides increased electrostatic force.

Dielectric fluids possess many other characteristics that are highly desirable and can enhance long-term reliability or provide new functionality. For example, the physical and chemical stability as well as anti-oxidation properties of many fluids are ideal for long-term reliability. Many dielectric fluids behave as an incompressible fluid under a range of operating conditions. This allows use of the fluid as a 'hydraulic' actuator. Furthermore the significantly increased breakdown strength of high quality dielectric fluids allows reduction in the likelihood of electrical discharge or arcing in the case of voltage transients. The increased dielectric strength and mechanical filtering properties of the fluid also allows the ability to implement a variety of different control techniques and driving waveforms. For example, pulse width modulation (PWM) methods with larger voltage ranges and fast drive transients are feasible when a fluid environment is provided. The high thermal conductivity of the fluids also provides improved heat transfer, allowing higher power handling.

Figure 20:
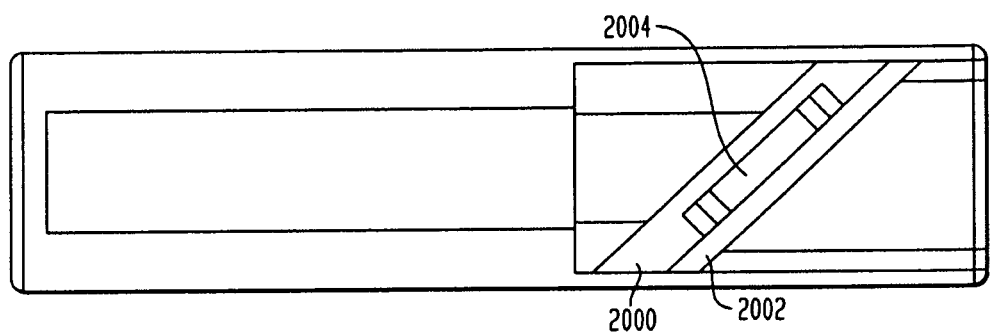
FIG. 20 is a cross sectional view of a MEMS mounting system using a dielectric fluid according to an illustrative embodiment of the invention.

A fluidic MEMS packaging technique according to an illustrative embodiment of the invention is described with reference to FIG. 20. A dielectric fluid 2000 can be enclosed around a die 2004 in the space bounded by the die holder 2002, for example. Dielectric fluids are available in a wide range of optical indexes, allowing index matching between the lens and the probe environment housing the scanning system. Proper index matching reduces reflections and dispersion; thereby decreasing ghost lines and signal loss of both the exiting and returning beam.

Dielectric fluids are commercially available in a wide range of viscosities and may be engineered to obtain a specific viscosity. Typical MEMS devices may be mechanically modeled as second order (or higher order for coupled masses) systems. Often MEMS devices exhibit mechanical quality factors on the order of 100. These under-damped systems are prone to ringing and susceptibility to noise at or near the mechanical resonance frequency. Mechanically damping the system employing a fluidic environment can eliminate the peak in the mechanical transfer function. The level of damping can be adjusted via the use of optimized fluid viscosities.

Figure 21:
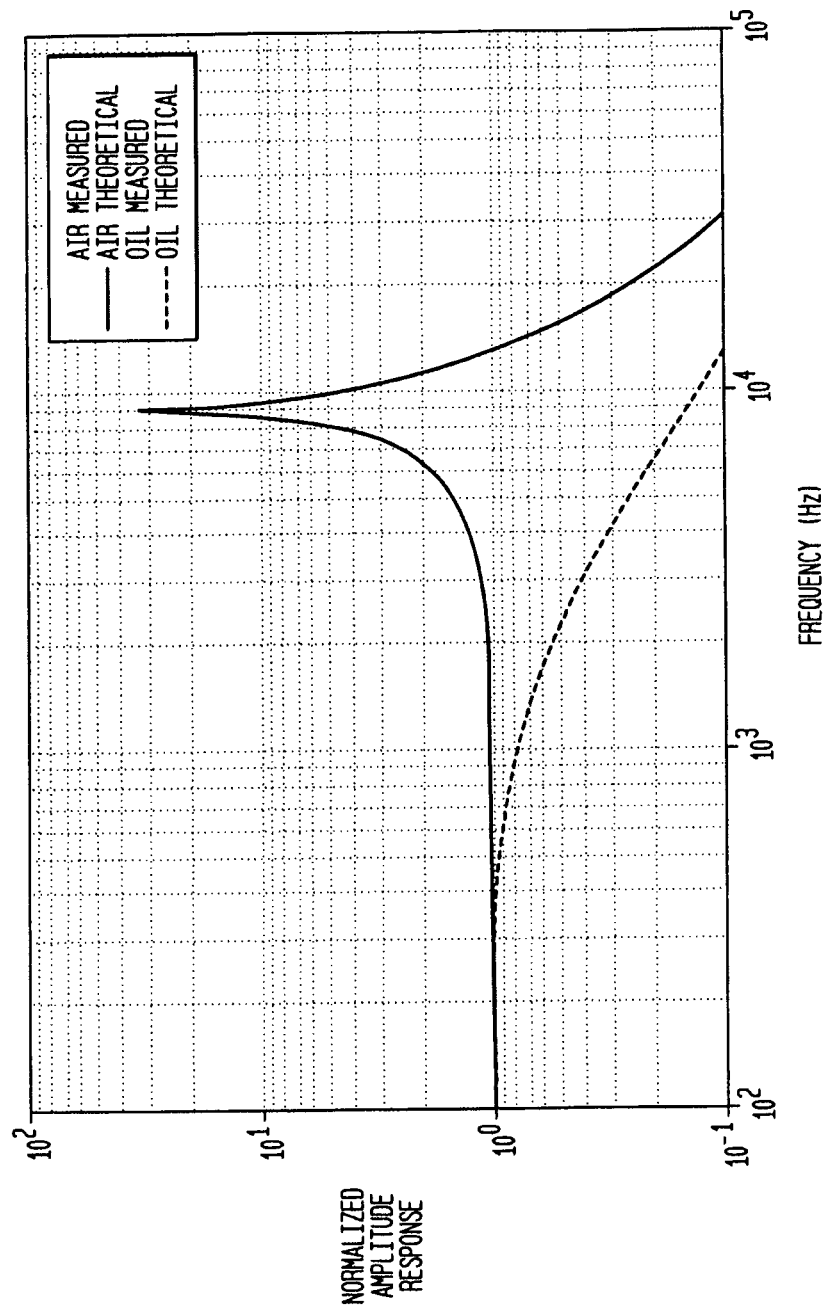
FIG. 21 is a frequency response chart comparing air and fluid embodiments of the present invention.

FIG. 21 shows a plot of the normalized frequency response of a MEMS device operating in air and dielectric fluid, in air the device is under-damped, while in fluid the device exhibits an over-damped response. The level of damping is determined by the viscosity of the fluid. In the case of electrostatic actuation the force provided by a given actuator is increased by a factor of the dielectric constant of the fluid, thereby allowing either reduced drive voltage or increased actuation force to be achieved. This also couples with the increased damping to reduce settling time during a step. Dielectric fluids generally offer very high breakdown voltages, thereby reducing the possibility of damaging electrical discharge during undesirable voltage transients. This also allows larger voltage to be applied to the device prior to breakdown occurring. Coupled with the mechanical filtering characteristics of the fluid over-amplitude and high frequency drive pulses may be applied to "overdrive" the device, maximizing velocity during a step from one position to the next.

Figure 22A:
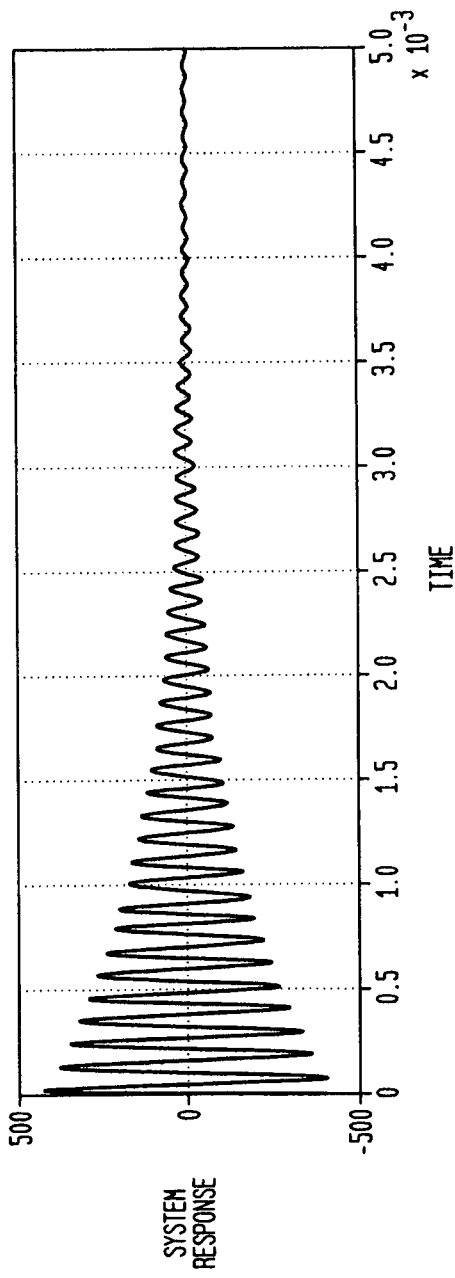
FIGS. 22A-22B are impulse response charts comparing air and fluid embodiments of the present invention.
Figure 22B:
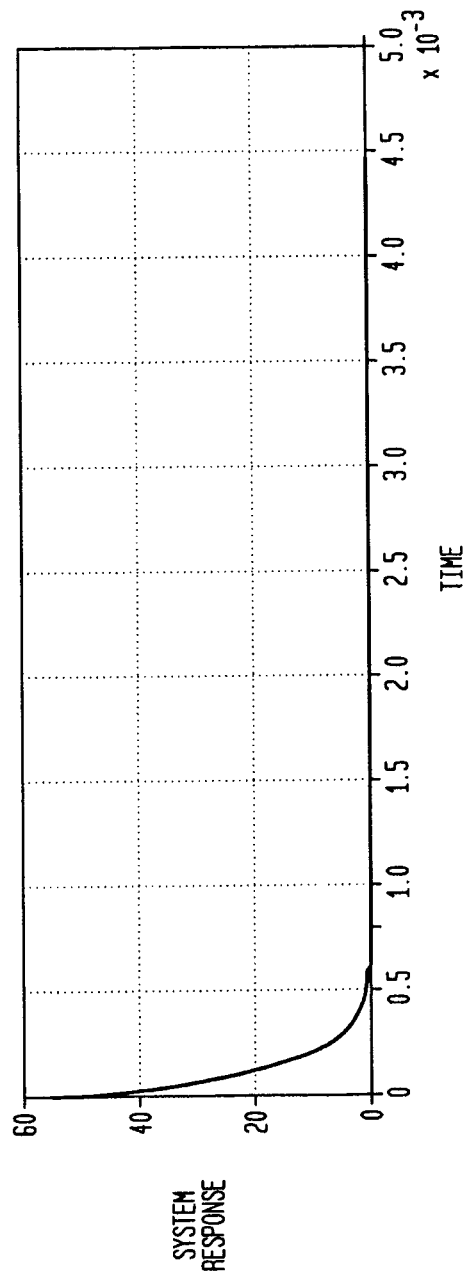

FIG. 22A shows a plot of the impulse response of a MEMS device operating in air and FIG. 22B shows a plot of the impulse response of the MEMS device operating in a dielectric fluid. In air, the device is under-damped, while in fluid the device exhibits an over-damped response. Note that there is no ringing in the case of the device operating in fluid. In addition, the amplitude of the initial response is decreased by almost an order of magnitude relative to the impulse response in air.

Figure 23A:
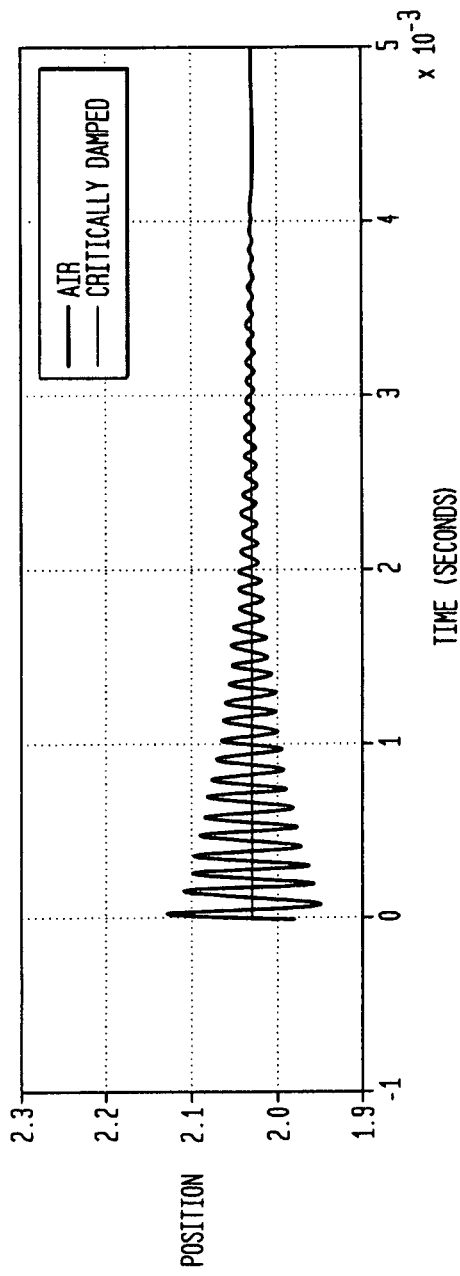
FIGS. 23A-23B are step response charts comparing air and fluid embodiments of the present invention.
Figure 23B:
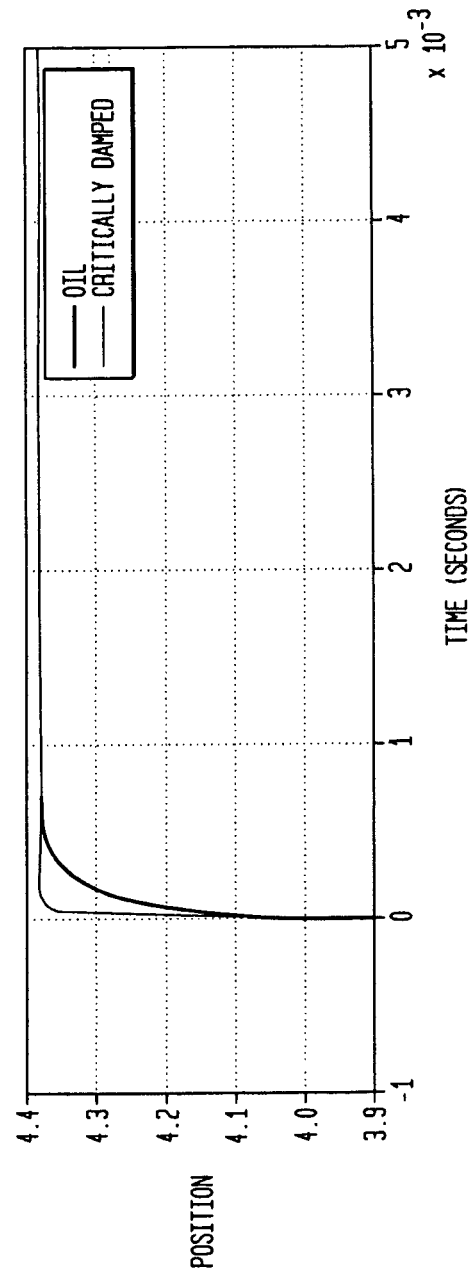

FIG. 23A shows a plot of the step response operating in air compared to a theoretical system with critical damping. Extended ringing can be noted in this plot. FIG. 23B shows a plot of the response in fluid for the same input step compared to a critically damped theoretical system. In the fluid environment, it can be noted that the capacitance measured position is initially larger and a larger step is achieved. This is due to the larger dielectric constant of the fluid.

Many dielectric fluids offer excellent physical and chemical stability as well as anti-oxidation properties, thereby offering long-term device protection. The large thermal conductivity of most dielectric fluids allows heat to be removed from the system, thereby permitting increased optical power handling even in the case of non-ideal optical elements. Using an incompressible dielectric fluid also provides the opportunity to employ the fluid as a "hydraulic fluid" to serve as a method of transferring force. This may be implemented to: translate a spring mounted scanning element to provide scanning along the axis of the probe; translate a spring mounted scanning element to provide focus; provide fluidic pressure or flow to actuate a mechanical motor in the form of a linear translation actuator; provide fluidic pressure or flow to actuate a mechanical motor in the form of a rotational actuator; apply fluidic pressure to a flexible lens to provide focus control; or apply fluidic pressure to a spring mounted optical lens to modulate the physical distance between the lens and other optical elements, for example.

Examples of fluids that can be used in MEMS packaging according to illustrative embodiments of the invention include stable polar or non-polar dielectric fluids, highly refined natural hydrocarbon based fluids and synthetic engineered dielectric fluids. A high pressure gaseous environment lacks the ability to control refractive index over a wide range, but can offer some improvements in damping and dielectric constant if the proper gas is chosen.

Many applications of a MEMS based probe have severe size constraints. For external operation the size is typically governed by the practicality for hand held use of the device. Generally, multiple levels of device packaging will be used at this scale. However, for internal operation, the probe may be placed in an endoscope port wherein the probe diameter is limited. In applications wherein the probe is used to study the inside of blood vessels, diameter is even more restricted. In various embodiments of the invention, the die is the largest component of the probe assembly in terms of the cross sectional diameter of a circle that it can be inscribed inside. It follows that the die must make very efficient use of available space.

Figure 24A:
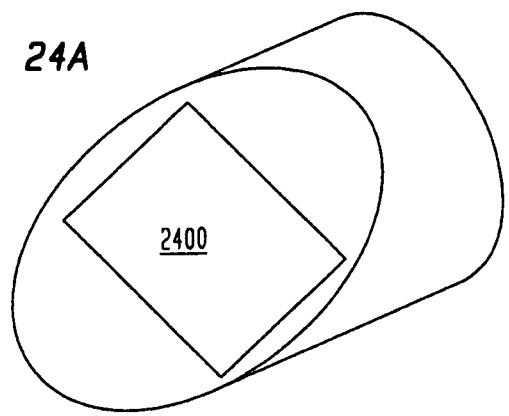
FIGS. 24A-24C are 3D drawings of a MEMS mounting surface illustrating different shaped MEMS dies according to illustrative embodiments of the present invention.
Figure 24B:
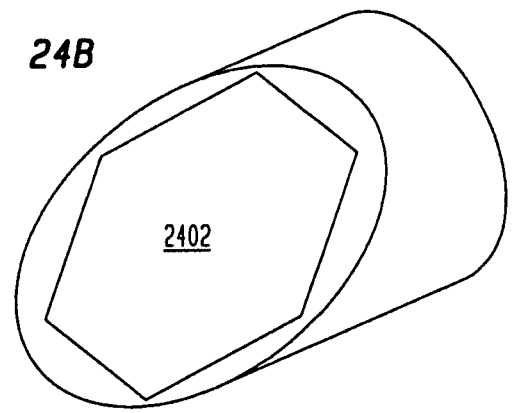
Figure 24C:
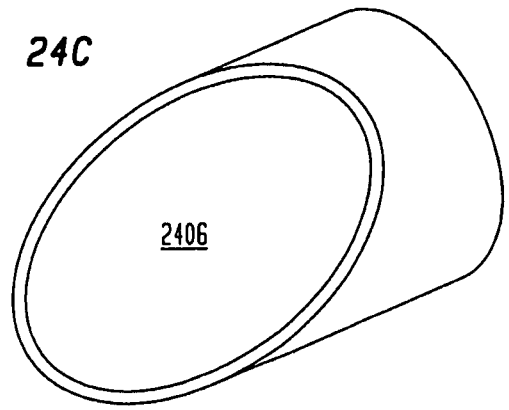

By using a non-rectangular die shape as shown for example in FIGS. 24B and 24C, more efficient utilization of space can be achieved as compared with a rectangular die shape 2400 shown in FIG. 24A. For example, FIG. 24B shows how a polygonal shape die 2402 may be used to better fit the MEMS mirror to the package and reduce the package size. Such polygonal shaped dies may be shaped as polygons in which every side is not the same length. FIG. 24C shows how an elliptical shape die 2404 may be used to exactly match the size and shape of the package. An elliptical shape provides for minimal package size for a given MEMS die. Irregular shapes may also be used depending on the geometry of the package.

Even more complex die shapes may be used for additional functionality. These may be combined with the nonrectangular dies discussed above. Holes and notches in the die can be used with locator structures for alignment or to facilitate interconnections. The die may be shaped using a number of methods including etching processes, sawing processes, milling processes, and laser based processing.

An illustrative embodiment of the present invention provides a two piece probe with alignment and die mounting on one piece while providing a window on the second piece. The embodiment consists essentially of two parts: a bottom support structure, and a top cover. One benefit of this design is that the MEMS mirror pocket and the GRIN lens are both supported by a single solid piece. Alignment between the MEMS mirror and the GRIN lens depends only on the quality of a single part and does not depend on the tolerance of the joints between parts.

Figure 25:
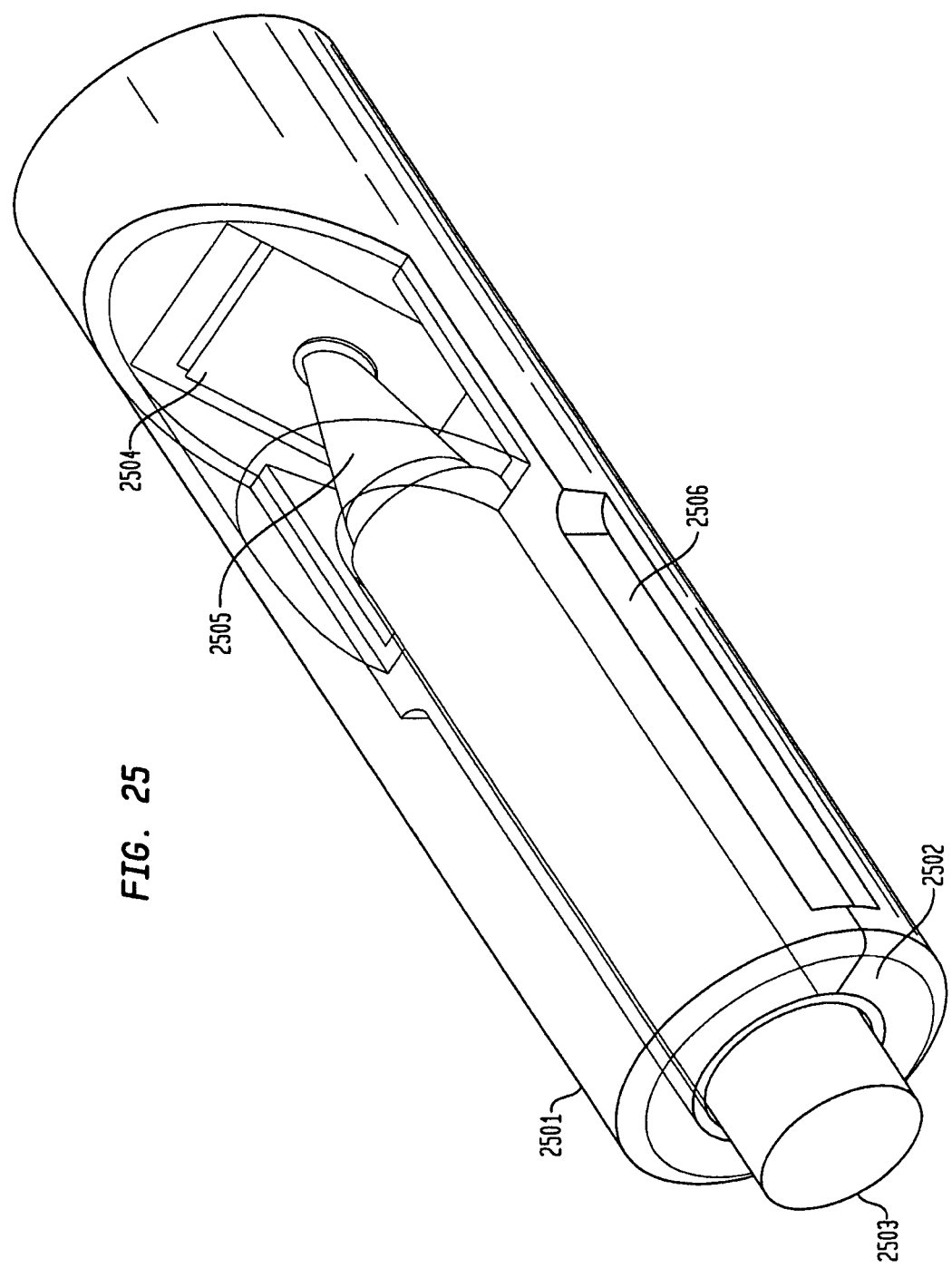
FIG. 25 is a 3D drawing of a two piece MEMS package holding a GRIN lens according to an illustrative embodiment of the invention.

FIG. 25 shows an embodiment of the probe package. The package is comprised of a cover 2501 and a base 2502. When assembled, the package has a tube for holding a GRIN lens 2503 which focuses a laser 2505 onto a MEMS device 2504. In FIG. 25, the cover and base are connected by a dove-tail arrangement, although the use of other joints is possible.

Figure 26:
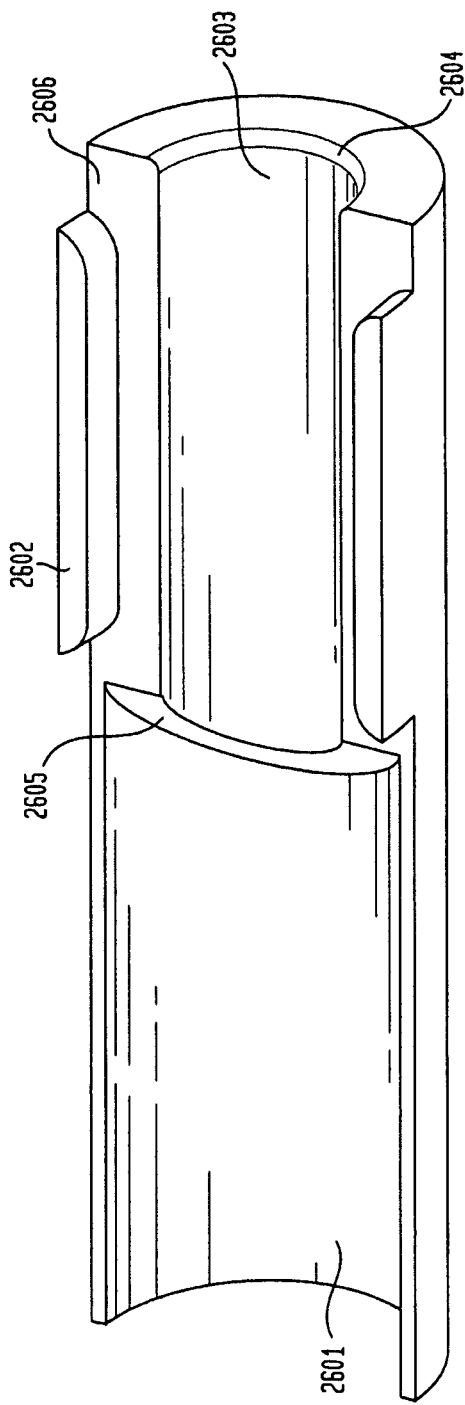
FIG. 26 is a 3D view of a cover piece of a two piece MEMS package according to an illustrative embodiment of the invention.
Figure 29:
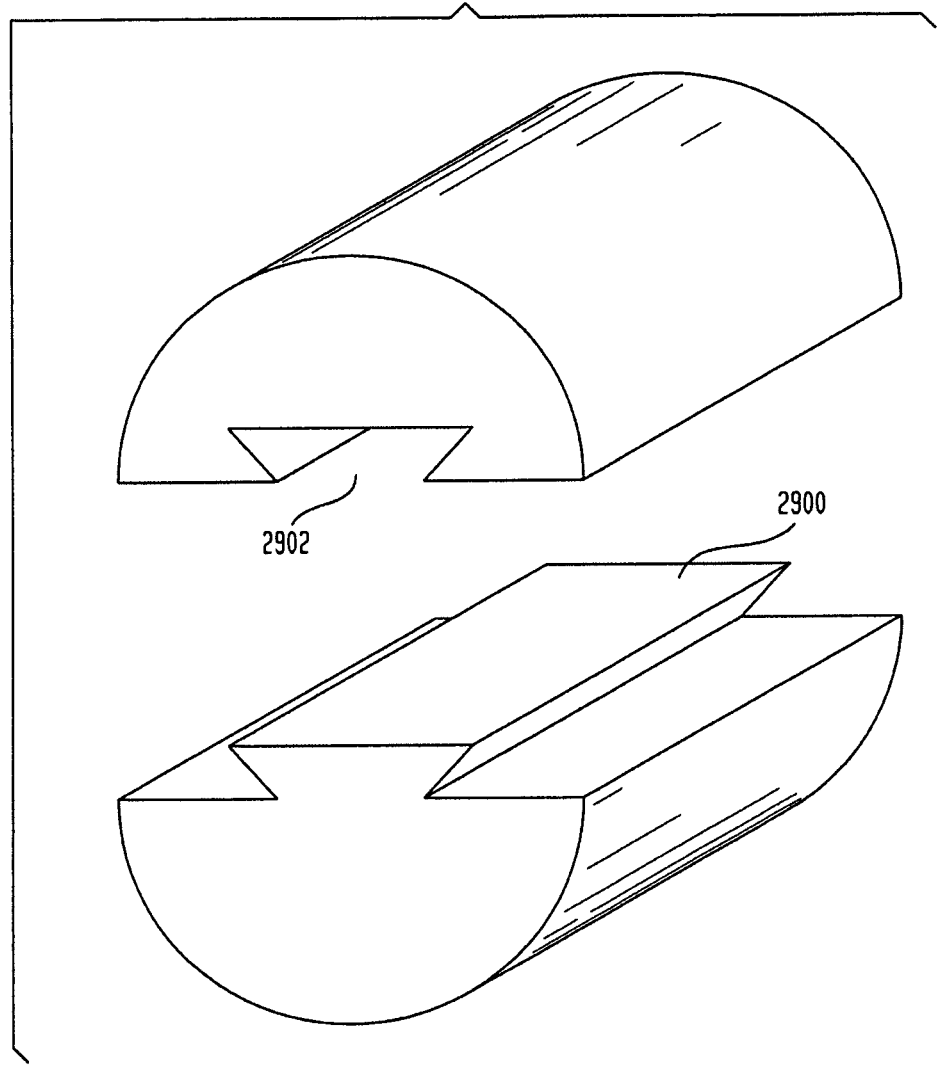
FIG. 29 is an exploded view of a slider joint between a base piece and a cover piece of a two piece MEMS package according to an illustrative embodiment of the present invention.

FIG. 26 shows an embodiment for the cover piece of the package. The window area 2601 is generally transparent and may be a separate piece or a lens as described herein. The window may also utilize any of the mucus dispersion techniques described herein. The dove-tail structure 2602 is one of a number of connection techniques that may be used to join the cover with the base. Other mechanisms for joining the cover and the base include an angled dove-tail wherein the angle of convergence between the cover and base can be controlled. This allows for the precisely controlling the angle of interconnection with the die and a slider mechanism that is shown in FIG. 29. The slider mechanism allows for a tighter seal between the cover and base and also provides improved wire routing capabilities. The cavity 2603 is designed to hold the GRIN lens and can be virtually any shape as disclosed herein. The lip 2604 enables easier insertion of the GRIN lens. The surface 2606 may be used for electrical routing, particularly the use of a thin flexible substrate as herein. The surface 2605 may be used for electrical routing techniques as described herein or it may be used as an anchor point for connections to the die.

Figure 27:
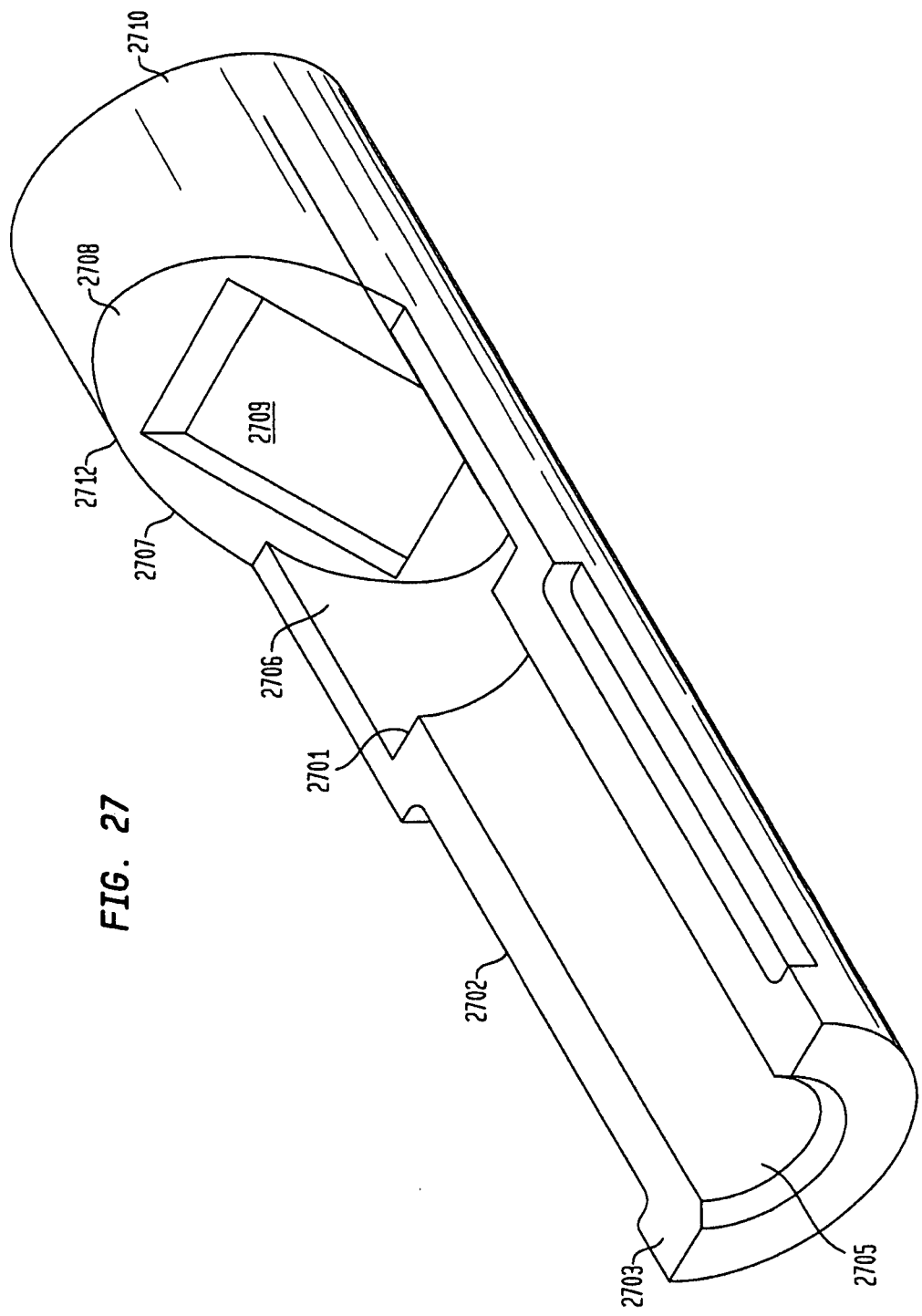
FIG. 27 is a 3D view of a base piece of a two piece MEMS package according to an illustrative embodiment of the present invention.

FIG. 27 shows the base of this package embodiment. The dove-tail 2702 provides an appropriate mating structure to secure the cover. Alternatively the dove-tail structure can be replaced with the slider 2900 and groove 2902 structure as shown in FIG. 29. The surface 2703 is a major point of contact between the cover and the base and is therefore important for the alignment of the GRIN lens. In addition, surface 2703 can be used to route electrical signals as described herein. The recess 2705 is the GRIN lens holder. The cavity 2706 should be large enough to allow for electrical interconnects. The shape of the recess affects the type of signal pathways that can be used with this package. For example, if the recess is shallow, then a thin flexible substrate can be easily bonded to it. Wirebonding requires a deeper recess and also requires that wall 2701 be at an angle greater than 90 degrees to surface 2707 to allow clearance for a wirebonding tool. In addition, cavity 2706 is used to hold fluid in embodiments wherein the MEMS device operates in a fluid environment. Cavity 2706 is located where a getter material would be placed to absorb moisture. Surface 2707 can be used to hold a MEMS device that has been molded into the substrate as described herein and to provide a location for wire bond pads. Holes 2708 may contain conductive wires, pins, or epoxy which provide the wire bond pads that the MEMS device connects to. The pocket 2709 holds the die in place and may contain any backside connections as discussed herein. The pocket 2709 may also contain centering springs as described herein. The bottom of pocket 2709 may contain compressible material as described herein. Pocket 2709 and surface 2707 may be of a different size or shape should the MEMS device not be rectangular, as described herein. Surface 2710 provides the exterior surface of the package. This exterior surface can be used for electrical signal routing and may be textured to better grip a probe sheath. A recess along edge 2712 could be used in conjunction with a longer window 2701 to seal cavity 2706.

Figure 28:
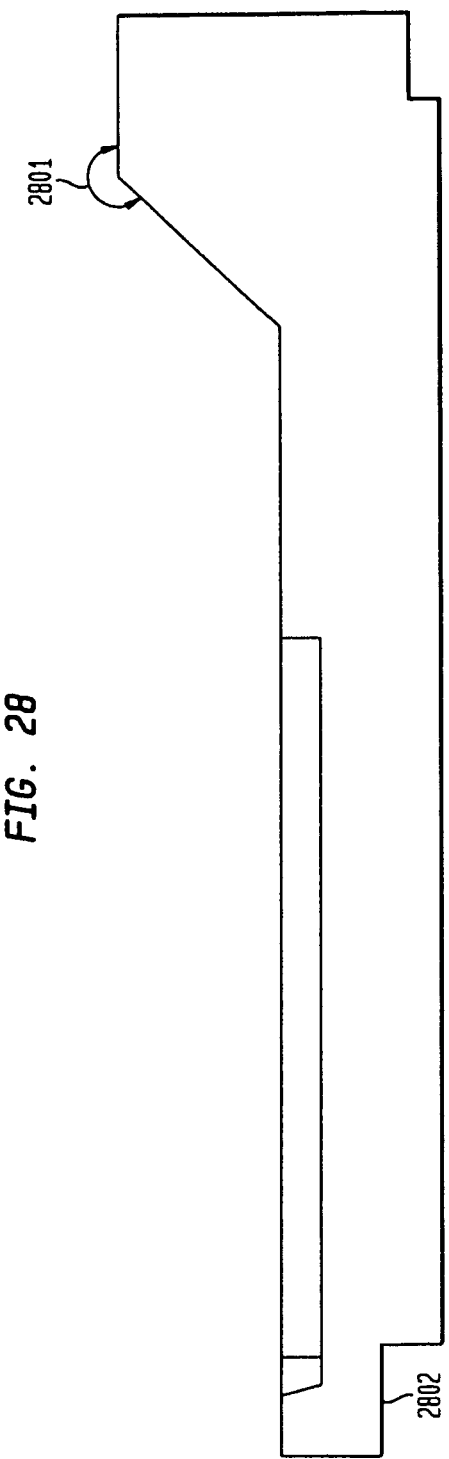
FIG. 28 is a side elevation view of a base piece of a two piece MEMS package according to an illustrative embodiment of the present invention.

FIG. 28 shows a side view of the base. The angle 2801 determines a central angle of the laser when the MEMS mirror is in its uncharged position. Angle 2801 can be between 270 degrees and 180 degrees with appropriate changes to the design. Recess 2802 can be used as solder pad when any electrical connections are needed from the surface of the package to wires.

FIG. 29 shows the slider joint constructed with slider 2900 and groove 2902. The slider joint ensures tight control of the motion between the cover and the base during package closure.

The two parts of the two-piece probe embodiment can be fabricated using plastic molding techniques, machining of materials, including quartz and other minerals, metals, glass, and plastic; ceramic molding or machining; metal or ceramic sintering; machined or molded layered fiber composites; or decomposable materials.

Another illustrative embodiment of the invention provides a tube package with an angled die plug. The tube package provides an improved seal between the optics of an optical MEMS device and the exterior environment. A seam of the package is minimized and is many times smaller than the two piece package as described above. In addition, the contact parts in a tubular design can be circular, which allows for the use of o-ring gaskets as well as other mechanical sealing techniques.

Figure 30:
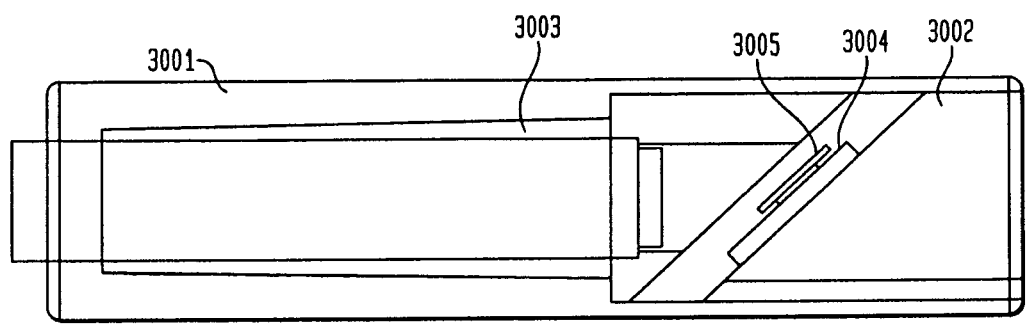
FIG. 30 is a cross sectional view of a MEMS package according to an illustrative embodiment of the invention.

FIG. 30 shows an assembly of all the pieces of the illustrative probe package. It consists of a tube 3001 that supports the GRIN lens and the lens wedge 3003, provides a window or lens for output, supports electrical signal routing, may provide connections to the MEMS device, and that supports the die holder 3002. The die holder 3002 may also provide interconnections to the MEMS devices, align the MEMS device and provide connections to functional tips. The die holder 3002 may connect to the tube 3001 by means of a threaded screw connection or a press connection. The lens wedge 3003 supports one end of the GRIN lens. This allows for necessary draft angles during injection molding. The MEMS device sits at region 3004. Region 3005 is the gap between the tube 3001 and the die holder 3002. This is the location in which a getter material would be placed. In embodiments wherein the MEMS device operates in a fluid environment, region 3005 may be filled with fluid.

Figure 31:
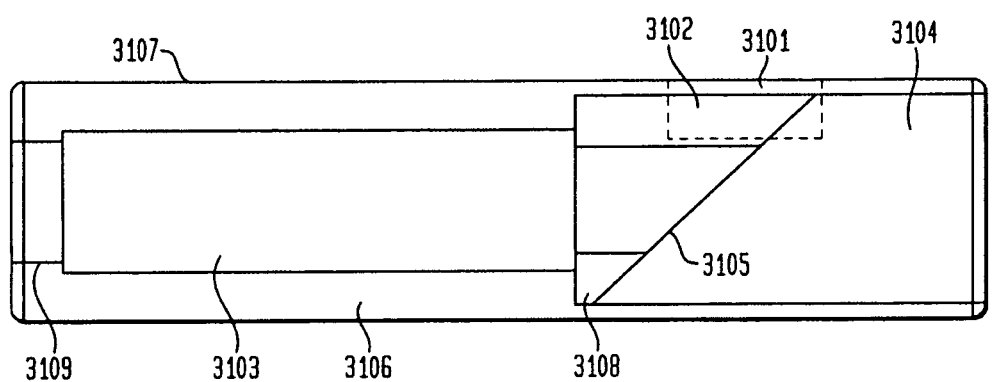
FIG. 31 is a cross sectional view of a MEMS package according to an illustrative embodiment of the invention.

FIG. 31 shows an overview of the tube part of the package. The window area 3101 is generally transparent and may be a separate piece or a lens as discussed herein with reference to FIG. 18. Recess 3102 removes any obstructions between the MEMS mirror and the window. Its size is determined by the maximum angle achievable by the MEMS mirror. The cavity 3103 is designed to hold the GRIN lens and can be any shape discussed herein. If the tube is molded and not machined it may will have a taper, unlike the purely cylindrical GRIN lens. To compensate for this, the lens may be held at specific locations such as at each end. Protrusion 3109 supports the lens at one end while space is provided in recess 3108 for the lens wedge which will hold the other side of the GRIN lens. Cavity 3104 is the area where the lens holder is placed. The outer walls of this cavity may be threaded in the embodiments wherein a screw joint between the tube and the die holder is used. Wall 3105 supports interconnects to the die that come from a top surface as described herein. Volume 3106 holds molded in place signal pathways as described herein. These signal pathways then pierce wall 3105 to attach to wiring or interconnects. The outer surface of the package 3107 may have elements to secure a protective sheath.

Figure 32:
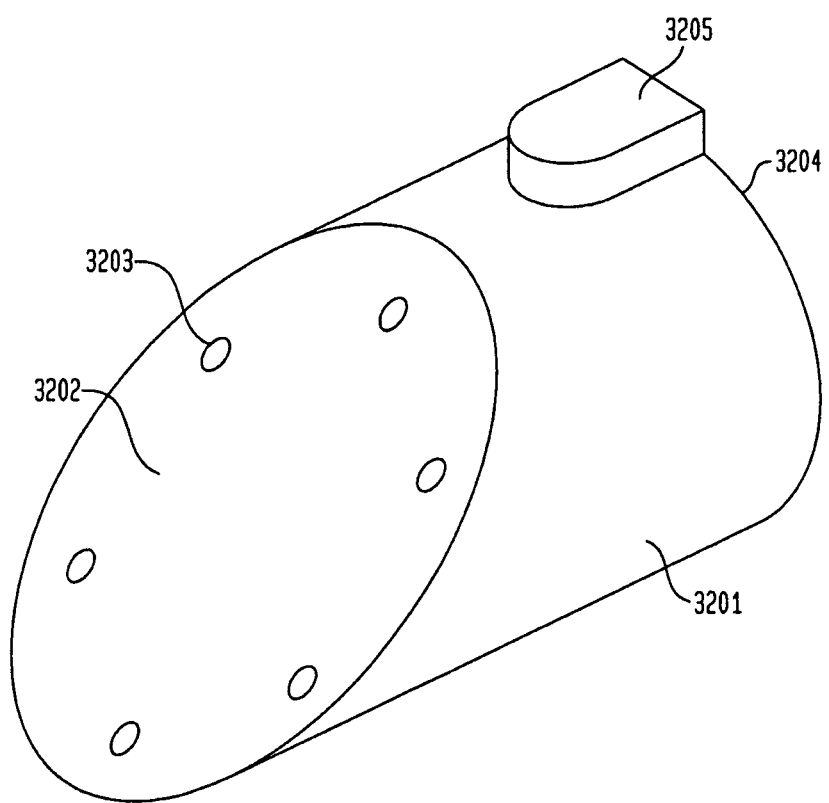
FIG. 32 is a 3D view of a MEMS die holder according to an illustrative embodiment of the invention.

FIG. 32 is an embodiment of the die holder. The outer surface 3201 mates with the tube. The mechanical tolerance and the surface morphology of this surface are critical to ensuring that proper alignment occurs after assembly of the package. The outer surface 3201 can be threaded in embodiments wherein a screw method of joining these parts is used. When a press fit method of assembly be used, the key 3205 can be used to ensure proper alignment. Surface 3202 provides the die holder. In the embodiment shown, the die sits directly on the surface and is secured with tape or adhesive. Wire bond pads are provided on surface 3207. The die holder could contain a pocket as discussed herein. Holes 3203 are shown which can contain conductive wires, pins, or epoxy which provide the wire bond pads that the MEMS device connects to. The cavity 3204 is used for wire routing and to ensure constant wall thickness. Cavity 3204 can also interface with functional tips as described in Applicant's co-pending Application No. 60/908,473 filed Mar. 28, 2007 which is incorporated herein by reference.

Figure 33:
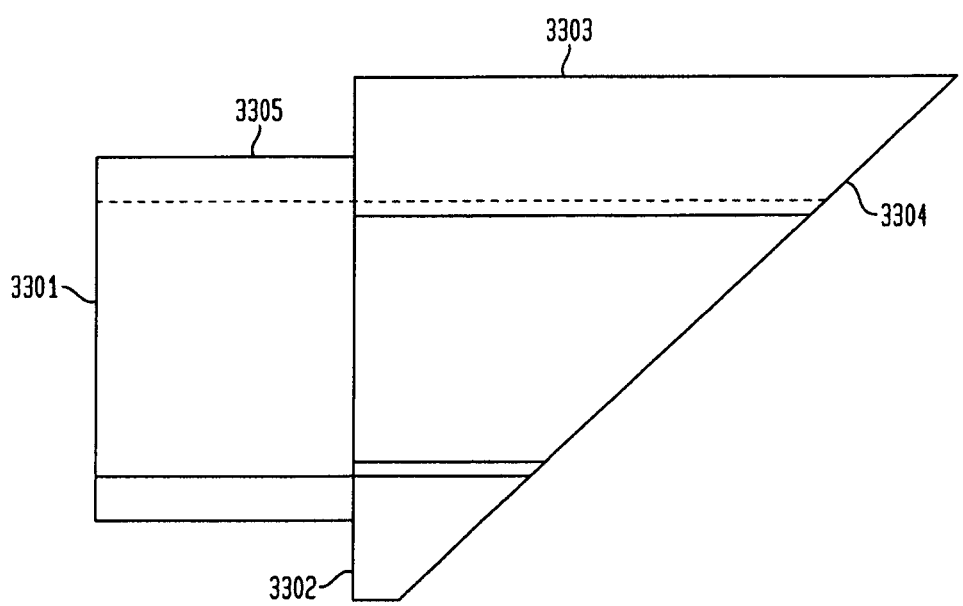
FIG. 33 is cross sectional view of a lens wedge according to an illustrative embodiment of the invention.

FIG. 33 shows the lens wedge. The GRIN lens support structure may include a draft angle if it is made by a molding process. The lens wedge compensates for this draft angle. It is possible for the lens wedge to be made out of two symmetrical interlocking pieces, however the embodiment shown is a one piece design. Hole 3301 is one of two supports for the lens. The other support would be provided by the package tube described above. The lens need not be in contact with the lens wedge throughout the entire piece, due to draft angle requirements when the lens wedge is fabricated. Surface 3305 contacts the lens support in the package tube. The mechanical tolerance and finish of surface 3305 is significant to proper lens alignment. Flange 3302 prevents the lens wedge from being inserted too far. Surface 3303 may be keyed or shaped to ensure that the lens wedge sits properly. Surface 3304 is angled to provide clearance for the MEMS die.

The tube package with angled die plug can be fabricated using plastic molding techniques including injection molding, and thermoset molding or by machining of materials, including quartz and other minerals, metals, glass, and plastic. Alternatively, the package may be fabricated using ceramic molding or machining, metal or ceramic sintering, machined or molded layered fiber composites, or decomposable materials.

According to the embodiment described with reference to FIGS. 34-37, a method of modular manufacturing of a package is presented wherein the functional tip can be one module, the cap and holder can be another module, and the lens and tube can be a third module. By using the inventive connection methods described herein between these pieces, any number of designs can be quickly and easily manufactured from pre-assembled components.

In an illustrative embodiment a die prepackage design may be used which is similar to the tube design presented above. For example, the connections to the die in a prepackaged embodiment can be exactly the same as the connections to the die in a tube embodiment. The primary difference is the addition of a third piece, the cap. The cap allows for a single packaged die to be used in a variety of different packaging embodiments with different sizes and shapes. By simply changing the tube size, or even by using an entirely different design for the optics, the entire package functionality can be changed. However, the same sub-package of the MEMS die, the holder, and the cap can be used with all designs. If other components in a system are molded in a similar fashion, an arbitrarily complicated optical assembly can be put together simply by snapping different pieces together.

Figure 34:
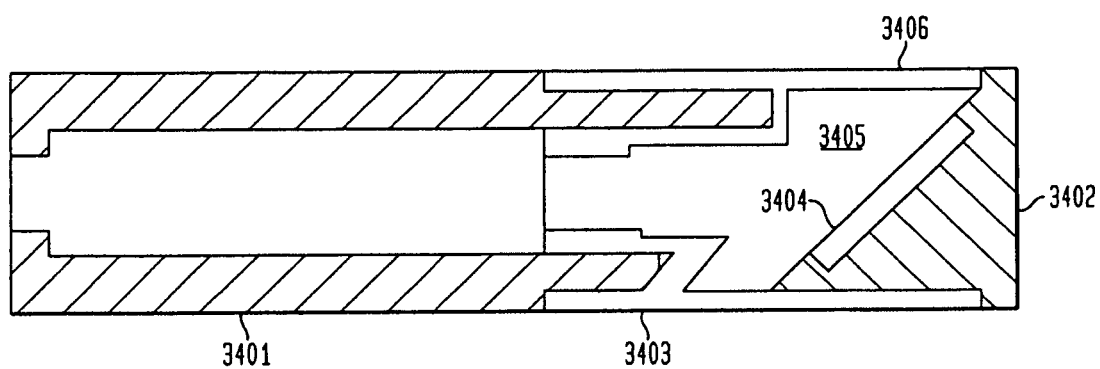
FIG. 34 is cross section of a MEMS package according to an illustrative embodiment of the invention.

FIG. 34 shows the overview of the die prepackage design. Tube 3401 holds and protects the GRIN lens. The tube is connected to the cap 3403 through a press fit or screw fit. A gasket or o-ring can be present in this connection to ensure a liquid resistant seal. Region 3405 shows an area of the package that is an optical passage to the window. There is optical clearance from the die 3404 to the window 3406. The die holder 3402 is press fit into the cap 3403 as shown, however it may also be provided as a screw connection. A gasket or o-ring seal may also be provided at this connection.

Figure 35:
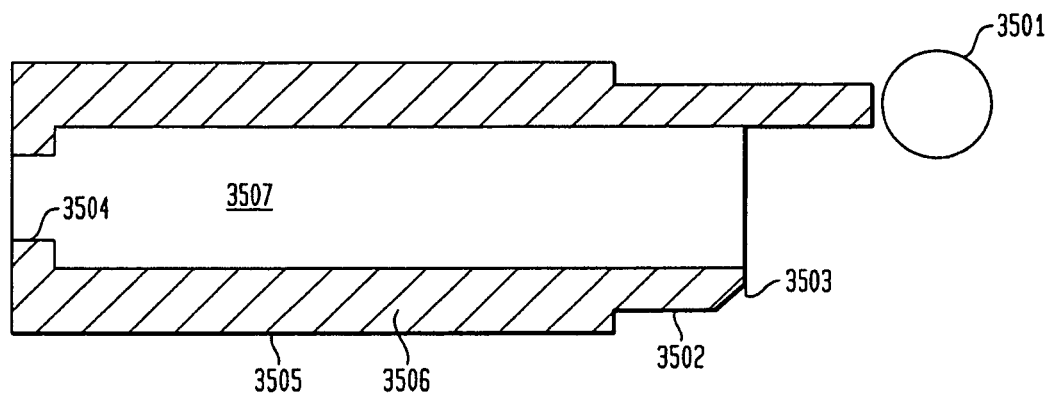
FIG. 35 is a cross section of a tube portion of a MEMS package according to an illustrative embodiment of the invention.

FIG. 35 is an embodiment of the tube. The tube is designed to ensure that it does not obstruct the window by providing a hole at 3501. The GRIN lens sits on lip 3504 and continues through the remainder of the tube 3507. The remainder of the tube 3507 may have a taper, for example, if the piece is molded during fabrication so the lip 3504 is required for accurate alignment. The outside of the tube 3505 and the inside of the tube 3506 can both be used for wiring purposes. Surface 3503 contacts the angled surface of the cap and may be used for electrical connections. Surface 3502 contacts a groove on the cap and may be used to seal the package and for connections.

Figure 36:
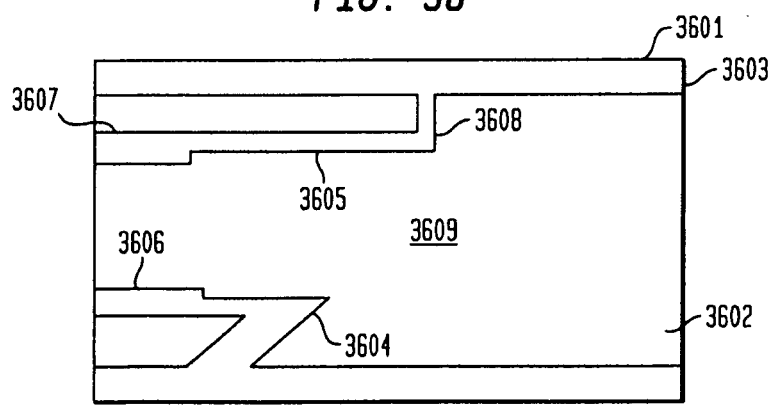
FIG. 36 is a cross sectional view of a cap portion of a MEMS package according to an illustrative embodiment of the invention.

FIG. 36 shows one potential cross section of the cap, however this piece can vary greatly in size and shape according to various illustrative embodiments of the invention. The cap includes a window 3601 which can also be a lens. Region 3608 shows a "hole" in the tube that is not shown in the cross sectional view of FIG. 36. The hole is provided to ensure a clear optical pathway to the window. The surface 3602 is used to hold the die holder and may contain wiring connections to the die holder. Angled surface 3604 may contain connections to the die from the top side. Opening 3609 may contain a window so that when the die holder is inserted, this section of the package is protected from the environment. In addition, this may more easily facilitate packaging in a fluid as described herein because this the cap and the die holder can be assembled in the fluid while other optical components are attached in a clean, non-liquid, environment. Lip 3606 holds the GRIN lens securely. Surface 3605 can be used to carry electrical signals to the angled plate 3604. The connections travel through or on plate 3604. Region 3607 is used to connect to the tube and may be threaded or contain and o-ring or gasket, as well as electrical signal pathways.

Figure 37:
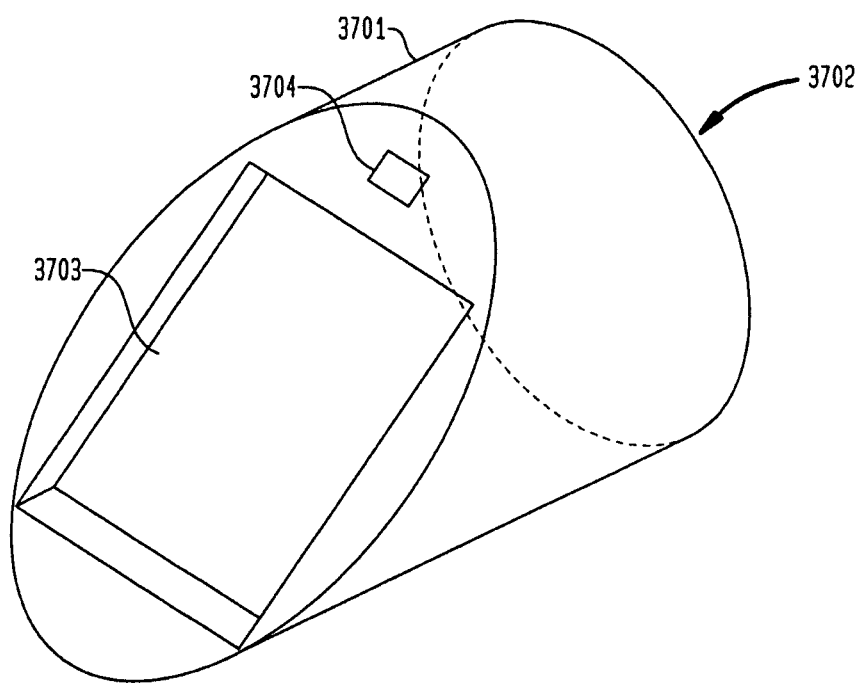
FIG. 37 is a 3D view of a MEMS die holder according to an illustrative embodiment of the invention.

FIG. 37 shows the die holder. Surface 3701 is in contact with the cap. The quality of this surface 3701 strongly influences the alignment of the system. Surface 3701 can also be used to provide pads for electrical connections and my contain an alignment key or other alignment features. The back of the die holder 3702 may contain signal pathways or may be hollow for wiring or for use with functional tips. The pocket 3703 may be any shape described above, or it may be replaced by using a flat surface in certain embodiments. Alternatively, in place of the pocket, the MEMS die may be embedded in the die holder. Bond pads or other connection pads 3704 may be placed on the die holder or molded into it.

Although embodiments of the present invention are described in terms of a MEMS based probe for an optical chromatic tomography (OCT) system, persons having ordinary skill in the art should understand that the inventive features and methods disclose herein may also be used to provide MEMS packages for use in a variety of other applications including electronics, and non-optical MEMS. Such applications may also include, but are not limited to: RF devices, where high quality waveguides and antennas may be integrated with active and passive components, semiconductors as well as MEMS devices to realize functional system; microfluidic systems, lab on a chip, system on a chip—where fluidic, electrical and optical connections are required; precision devices where excellent electrical shielding is required in a small low-cost form factor; biomedical devices, where biocompatibility or size is critical, i.e. pill cams, hearing aids; and consumer electronics, where cost and component count is of great concern, i.e. Cameras, cell phones, for example.

While embodiments of the invention are described herein in terms of aligning a MEMS device with optical components such as lenses, it should be understood that the inventive techniques described herein can also be used for aligning MEMS devices with other MEMS devices or with virtually any other component in a probe or other MEMS system.

While various embodiments of the invention are described herein in terms of wire-bonding to a MEMS die, it should be understood that the present invention may also be used to facilitate fabrication of various other types of electrical connections such as surface mount soldering, solder balls and the like.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention as set forth in the claims.

The invention claimed is:

1. A micro-electromechanical system (MEMS) package, comprising:
a single piece base structure;
a first surface of the single piece base structure defining a MEMS die mounting surface in said single piece base structure;
a second surface of the single piece base structure defining an optical component mounting surface in said single piece base structure, said optical component mounting surface and said MEMS die mounting surface positioned in an out of plane angular orientation with respect to one another, said out of plane angular orientation providing alignment between a MEMS die and an optical component mounted on said respective mounting surfaces;
a cavity in said single piece base structure between said MEMS die mounting surface and said optical component mounting surface; and
at least one optical imaging window, wherein said optical imaging window is monolithically fabricated with said package.

2. The package of claim 1, further comprising:
die alignment means on said die mounting surface.

3. The package of claim 2, wherein said die alignment means are selected from a group consisting of protrusions from said MEMS die mounting surface and depressions in said MEMS die mounting surface.

4. The package of claim 3, wherein said protrusions comprise electrically conductive posts.

5. The package of claim 3, wherein said depression comprises a die mounting pocket.

6. The package of claim 5, further comprising die alignment springs adapted for locating said MEMS die in said die mounting pocket.

7. The package of claim 2 wherein said die alignment means are adapted to align dies having shapes selected from the group consisting of elliptical, circular, and polygonal shapes.

8. The package of claim 1, further comprising at least one channel for receiving an electrical conduit to said MEMS die.

9. The package of claim 8, wherein said electrical conduit comprises a flexible circuit.

10. The package of claim 1, wherein the optical component is a discrete optical component.

11. The package of claim 10, wherein the optical component is a member of the group consisting of lenses.

12. The package of claim 10, wherein the optical component is a gradient index (GRIN) lens.

13. A method for aligning MEMS components in an optical device comprising:
- mounting a MEMS die in a package having a single piece base structure, a first surface of the single piece base structure defining a MEMS die mounting surface in said single piece base structure, a second surface of the single piece base structure defining an optical component mounting surface in said single piece base structure, and a cavity in said single piece base structure between said MEMS die mounting surface and said optical component mounting surface, said MEMS die mounting surface and said optical component mounting surface positioned in an out of plane angular orientation with respect to one another, said out of plane angular orientation providing alignment between said MEMS die and an optical component mounted on said respective mounting surfaces;
- mounting an optical component on said optical component mounting surface;
- coating a window of said package with a material having predetermined hydrophobicity; and
- selectively removing portions areas of said coating to form channels for guiding water.

14. The method of claim 13 further comprising:
- electrically connecting contact pads of said MEMS die to contact pads of a MEMS die adaptor plate; and
- electrically connecting said contact pads of said MEMS die adaptor to a flexible circuit extending from said package.

15. The method of claim 13, wherein the optical component is a discrete optical component.

16. The method of claim 15, wherein the optical component is a member of the group consisting of lenses.

17. The method of claim 15, wherein the optical component is a gradient index (GRIN) lens.

18. A micro-electromechanical system (MEMS) package, comprising:
- a first elongated structure, said first elongated structure being a single piece;
- a first surface of said first elongated structure defining an optical component mounting surface in said first elongated structure;
- a second surface of said first elongated structure defining a MEMS die mounting surface in said first elongated structure, said MEMS die mounting surface aligned in an out of plane angular orientation with said optical component mounting surface providing alignment between a MEMS die and an optical component mounted on said respective mounting surfaces;
- a cavity in said first elongated structure between said MEMS die mounting surface and said optical component mounting surface; and
- die alignment means on said MEMS die mounting surface, wherein said die alignment means are selected from a group consisting of protrusions from said MEMS die mounting surface and depressions in said MEMS die mounting surface and wherein said protrusions comprise electrically conductive posts.

19. The MEMS package of claim 18, further comprising:
- a second elongated structure secured to said first elongated structure; and
- at least one optical imaging window in said second elongated structure and positioned over said MEMS die mounting surface of said first elongated structure.

* * * * *